US008655137B2

(12) United States Patent
Baldassano et al.

(10) Patent No.: US 8,655,137 B2
(45) Date of Patent: Feb. 18, 2014

(54) DATACOMMUNICATIONS/ TELECOMMUNICATIONS PATCHING SYSTEMS WITH INTEGRATED CONNECTIVITY MODULE

(71) Applicant: CommScope, Inc. of North Carolina, Hickory, NC (US)

(72) Inventors: Matthew Baldassano, New York, NY (US); David Beihoff, Dallas, TX (US); Elyse Ge Hylander, Plano, TX (US); Scott Keith, Plano, TX (US); Ernest C. Pickens, Fairview, TX (US); Aaron Talmage Stout, Blue Ridge, TX (US); Yinglin Yang, Plano, TX (US); Timothy Anderson, Omaha, NE (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 13/909,944

(22) Filed: Jun. 4, 2013

(65) Prior Publication Data

US 2013/0266283 A1 Oct. 10, 2013

Related U.S. Application Data

(63) Continuation of application No. 12/862,105, filed on Aug. 24, 2010, now Pat. No. 8,472,774.

(60) Provisional application No. 61/237,002, filed on Aug. 26, 2009, provisional application No. 61/267,577, filed on Dec. 8, 2009.

(51) Int. Cl.
*G02B 6/00* (2006.01)
*G02B 6/44* (2006.01)
*H05K 5/00* (2006.01)
*H05K 5/06* (2006.01)

(52) U.S. Cl.
USPC ................ 385/135; 385/147; 174/50

(58) Field of Classification Search
USPC ............ 385/147, 137, 134, 135, 136; 174/37, 174/38, 50, 58
See application file for complete search history.

(56) References Cited

U.S. PATENT DOCUMENTS 5,339,379 A 8/1994 Kutsch et al.
7,481,029 B2 * 1/2009 McQuilken ................ 52/220.5
(Continued)

OTHER PUBLICATIONS

International Search Report and Written Opinion of related PCT Application No. PCT/US2010/046437, mail date Dec. 1, 2010.
(Continued)

*Primary Examiner* — Akm Enayet Ullah
(74) *Attorney, Agent, or Firm* — Myers Bigel Sibley & Sajovec, P.A.

(57) ABSTRACT

A module adapted for use with a datacommunications equipment mounting structure includes: a generally upright divider panel; a cover panel disposed generally parallel to the divider panel, the cover panel and divider panel being spaced apart from each other to form a gap; and a plurality of telecommunications cables, each of the telecommunications cables comprising a plurality of telecommunications patch cords, the cables comprising bundled patch cords at a first end and unbundled patch cords at a second opposite end, the cables being positioned in the gap between the divider panel and cover panel. The bundled patch cords at the cable first end include first interconnection terminals, and the unbundled patch cords at the second end include second interconnection terminals. The first terminals are located at first edges of the divider and cover panels. The unbundled patch cords are separately moveable between a stored position, in which the second terminals are located at second edges of the divider and cover panels, and an extended position, in which the second terminals are positioned away from the second edges of the divider and cover panels.

11 Claims, 25 Drawing Sheets

(56) References Cited

U.S. PATENT DOCUMENTS

| | | |
|---|---|---|
| 7,712,095 B2 | 5/2010 | Toyota et al. |
| 7,787,260 B2 * | 8/2010 | Hruby et al. .................. 361/827 |
| 7,808,793 B2 | 10/2010 | Nagao et al. |
| 7,995,357 B2 * | 8/2011 | Hruby et al. .................. 361/826 |
| 8,520,408 B2 * | 8/2013 | Hruby et al. .................. 361/827 |
| 2003/0194187 A1 | 10/2003 | Simmons et al. |
| 2004/0123113 A1 | 6/2004 | Mathiassen et al. |
| 2004/0161212 A1 | 8/2004 | Sun et al. |
| 2006/0027677 A1 | 2/2006 | Abts |
| 2012/0195019 A1 * | 8/2012 | Keith ........................... 361/827 |

OTHER PUBLICATIONS

International Preliminary Report of Patentability for related International Application No. PCT/US2010/046437, mail date Dec. 5, 2011.

* cited by examiner

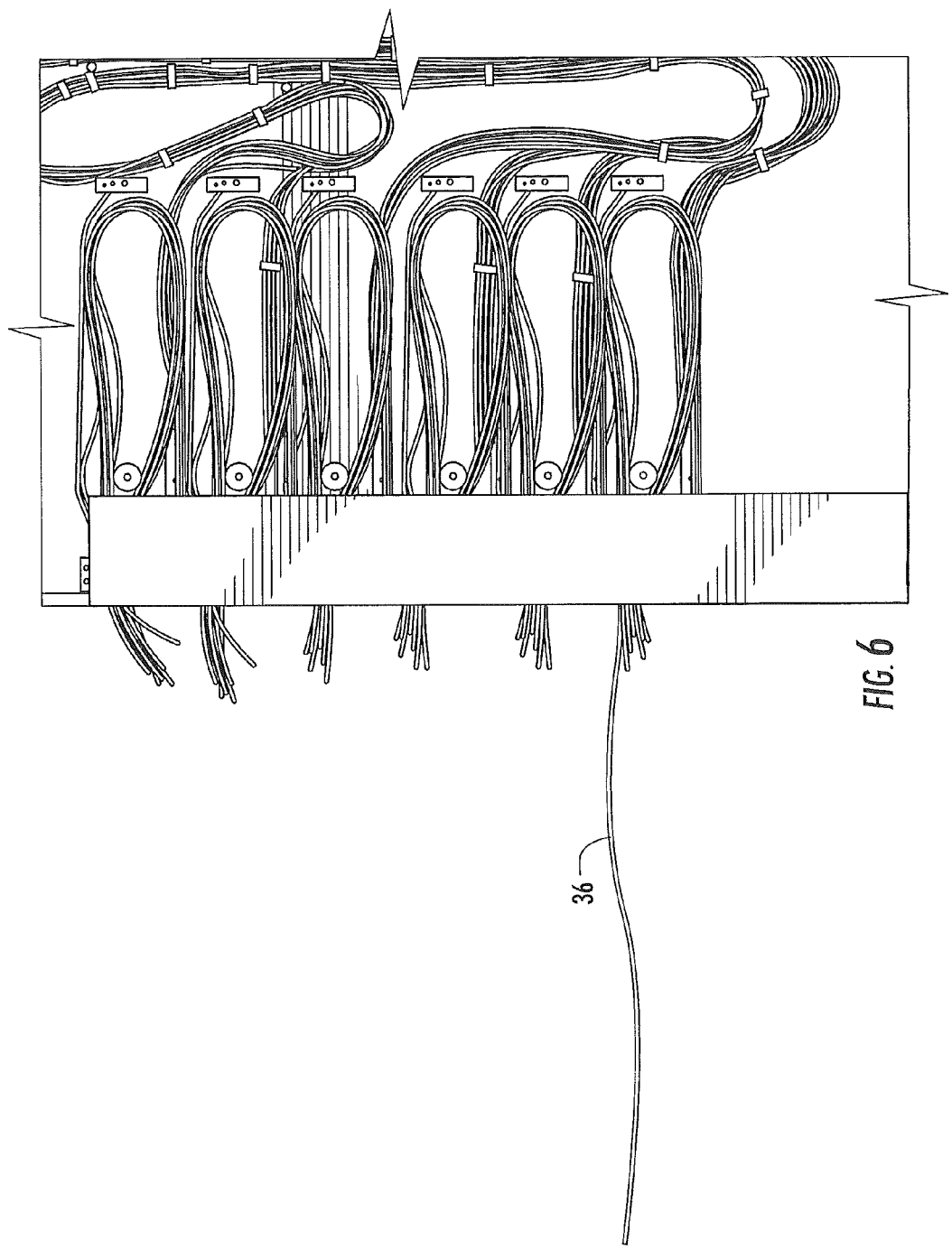

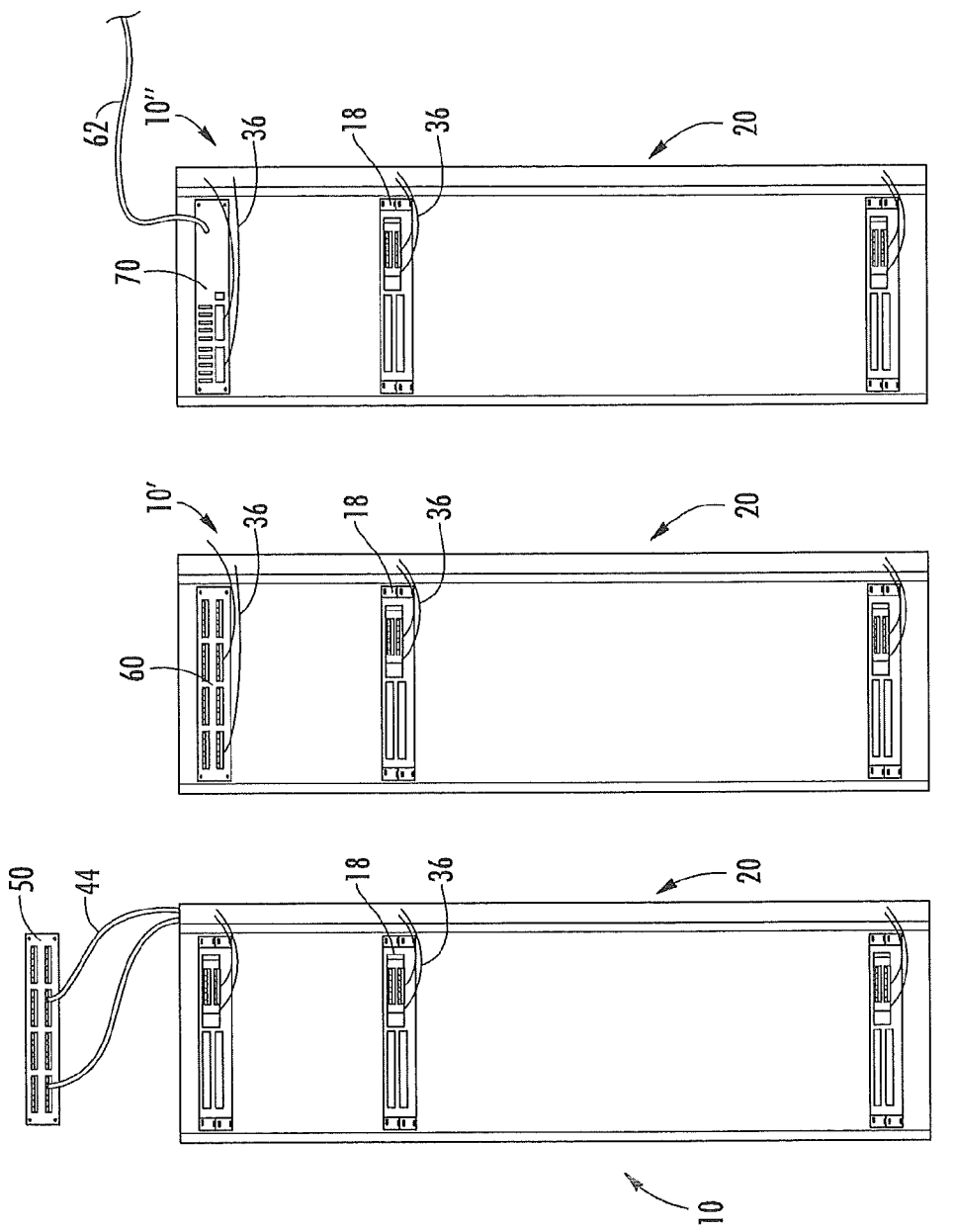

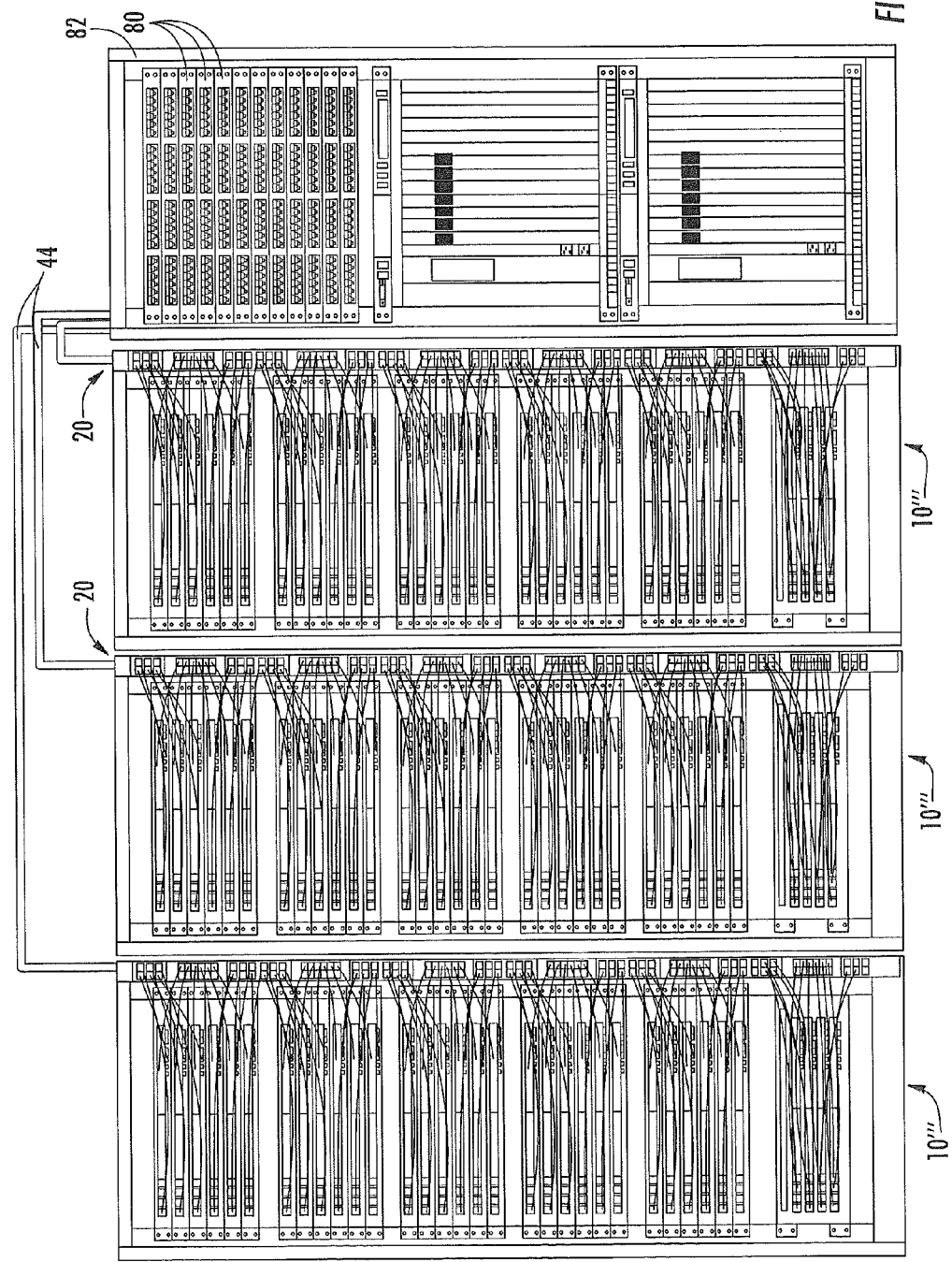

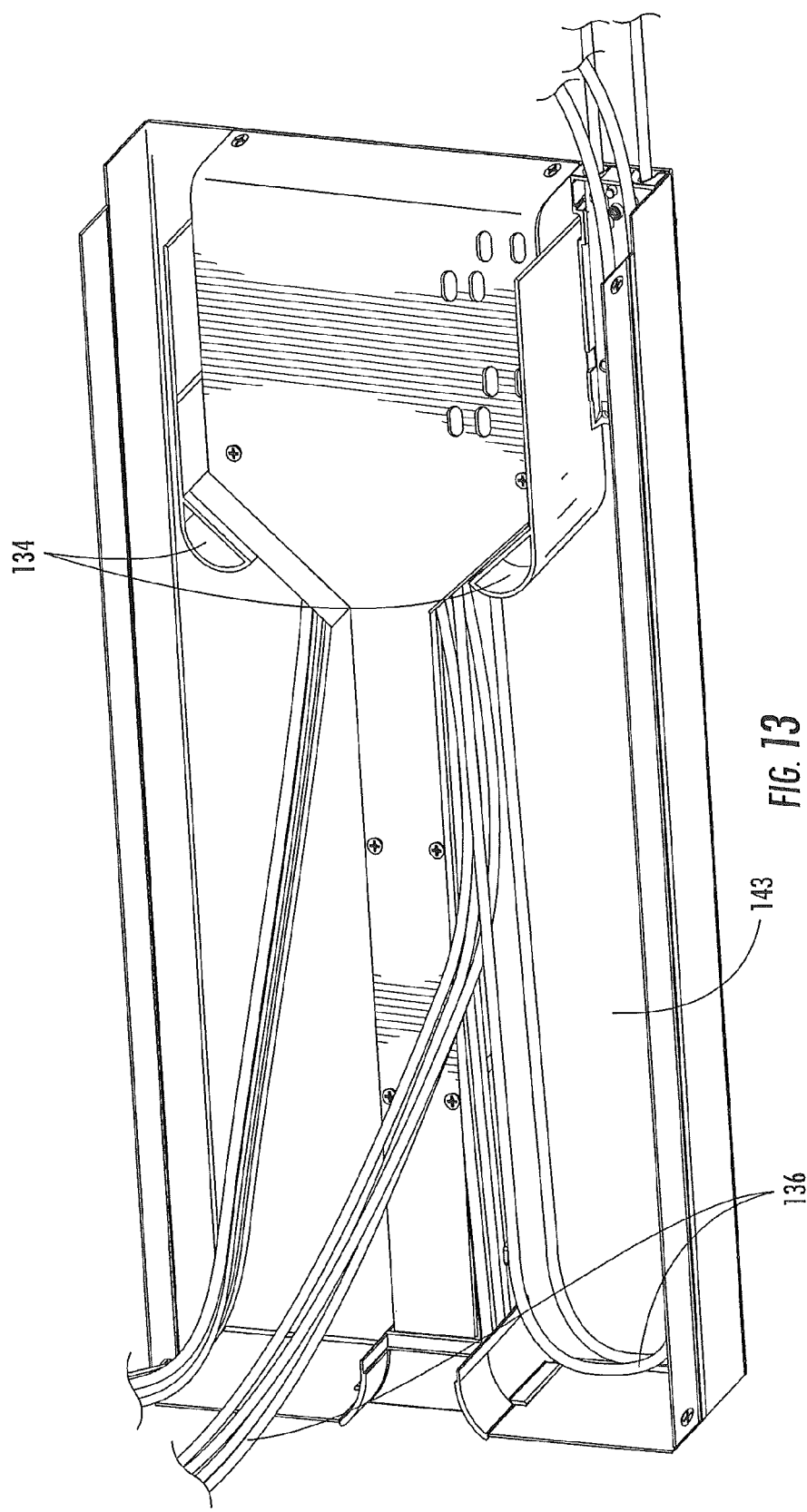

DATACOMMUNICATIONS/ TELECOMMUNICATIONS PATCHING SYSTEMS WITH INTEGRATED CONNECTIVITY MODULE

RELATED APPLICATIONS

The present invention is a continuation application of U.S. patent application Ser. No. 12/862,105, filed Aug. 24, 2010, which claims priority from U.S. Provisional Application No. 61/237,002, filed Aug. 26, 2009, and from U.S. Provisional Application No. 61/267,577, filed Dec. 8, 2009, the disclosure of each of which is hereby incorporated herein in its entirety.

FIELD OF THE INVENTION

The present invention relates generally to datacommunications/telecommunications equipment, and more particularly to high-density copper and fiber distribution apparatus.

BACKGROUND

In the datacommunications/telecommunications industry, the use of fiber optic cables for carrying transmission signals is rapidly and continually growing. To interconnect communication devices such as servers, routers and switches, fiber optic equipment, fiber distribution frames, racks and cabinets have been developed. Such frames, racks and cabinets are typically located in a communications closet, data room, data center or the like, where technicians can easily connect and reconnect, or "patch," equipment in an organized and efficient manner. Examples of fiber distribution frames and racks are shown in U.S. Pat. Nos. 5,497,444 and 5,758,003, which are hereby incorporated by reference.

With the increase in server deployments and use of other active network equipment utilizing fiber optic cables in the datacommunications/telecommunications industry (and often in conjunction with copper communications cables, cords and connections), it is desirable to provide fiber distribution frames/racks with increased density. "Density" refers to the number of locations, or ports, per unit volume or unit area for providing connections within the rack; thus, increased density can provide more connection/patching sites per rack. Many racks are configured to include multiple shelves or trays of a specific size (a standard height of 1.75 inches is known in the industry as a "U"); the size of a rack or cabinet may be described in terms of "U" (e.g., a "6U" rack), and the shelves and trays may be described by the number of connections per "U" (e.g., 48 connections/U). Some cabinets (so-called "0U" cabinets) have even been created that reserve all of the rack units for active computing equipment by utilizing space in the cabinet that is usually occupied by components for patching and cable/cord management. One benefit of this approach is the ability to preconfigure cabinets with the required copper and fiber connectivity for specific network equipment, This can allow for the rapid deployment of network equipment.

The space constraints associated with high-density distribution frames can cause cable and cord management problems. Effective cable/cord management can prevent excessive bending of fiber optic cables/cords within the frames. Effective cable/cord management may also reduce tangling of cables and cords, and may provide improved accessibility to components that may require servicing. Easily-understood labeling can also improve operator efficiency and accuracy. However, increased density can hamper desirable cable management practices, and the reduced volume available (such as in 0U cabinets) can make cable management more critical. There is a desire to make cabinets "plug and play" to make deployments of cabinets more rapid and to increase reliability.

SUMMARY

As a first aspect, embodiments of the present invention are directed to a module adapted for use with a telecommunications rack, frame or cabinet. The module comprises: a generally upright divider panel; a cover panel disposed generally parallel to the divider panel, the cover panel and divider panel being spaced apart from each other to form a gap; and a plurality of telecommunications cables, each of the telecommunications cables comprising a plurality of telecommunications patch cords, the cables comprising bundled patch cords at a first end and unbundled patch cords at a second opposite end, the cables being positioned in the gap between the divider panel and cover panel. The bundled patch cords at the cable first end include first interconnection terminals, and the unbundled patch cords at the second end include second interconnection terminals. The first terminals are located at upper edges of the divider and cover panels. The unbundled patch cords are separately moveable between a stored position, in which the second terminals are located at front edges of the divider and cover panels, and an extended position, in which the second terminals are positioned away from the front edges of the divider and cover panels.

As a second aspect, embodiments of the present invention are directed to a cassette for use in a telecommunications rack, frame or cabinet, comprising: a base panel; a cover panel disposed generally parallel to the divider panel, the cover panel and divider panel being spaced apart from each other to form a gap; a rear wall that spans the gap between the base panel and the cover panel, a rear aperture being present in the rear wall; a plurality of copper patch cords positioned in the gap between the divider panel and cover panel, the copper patch cords having first and second ends and being routed from the rear aperture to a front portion of the base panel and forming a copper patch cord slack loop, the first ends being adjacent the front portion of the base panel; and a plurality of fiber optic cables positioned in the gap between the divider panel and cover panel, the fiber optic cables having first and second ends and being routed from the rear aperture to a front portion of the base panel and forming a fiber optic cable slack loop, the first ends being adjacent the front portion of the base panel. The copper patch cords are separately moveable between a stored position, in which the first ends are located at adjacent front edges of the divider and cover panels, and an extended position, in which the first ends are positioned away from the front edges of the divider and cover panels. The fiber optic cables are separately moveable between a stored position, in which the first ends are located at adjacent front edges of the divider and cover panels, and an extended position, in which the first ends are positioned away from the front edges of the divider and cover panels.

As a third aspect, embodiments of the present invention are directed to a datacommunications equipment mounting structure, comprising: a housing with side walls; mounting features attached to the housing for mounting datacommunications equipment; a server mounted in the mounting features; and a plurality of communications cables or cords positioned in a gap between the server and one of the side walls, each of the cables or cords having a terminal on one end thereof. The cables or cords are separately moveable between a stored position, in which the terminals are located adjacent the gap, and an extended position, in which one or more of the terminals is connected with the server.

BRIEF DESCRIPTION OF THE FIGURES

FIG. 6 is a side view of an interconnection module similar to that shown in FIG. 1, wherein one of the cords is extended.

FIGS. 7A-7D are front views of different cabinet configurations utilizing modules according to embodiments of the present invention.

FIGS. 11-17 are sequential views of the assembly of a cord storage cassette according to additional embodiments of the present invention.

DETAILED DESCRIPTION

Figure 1:
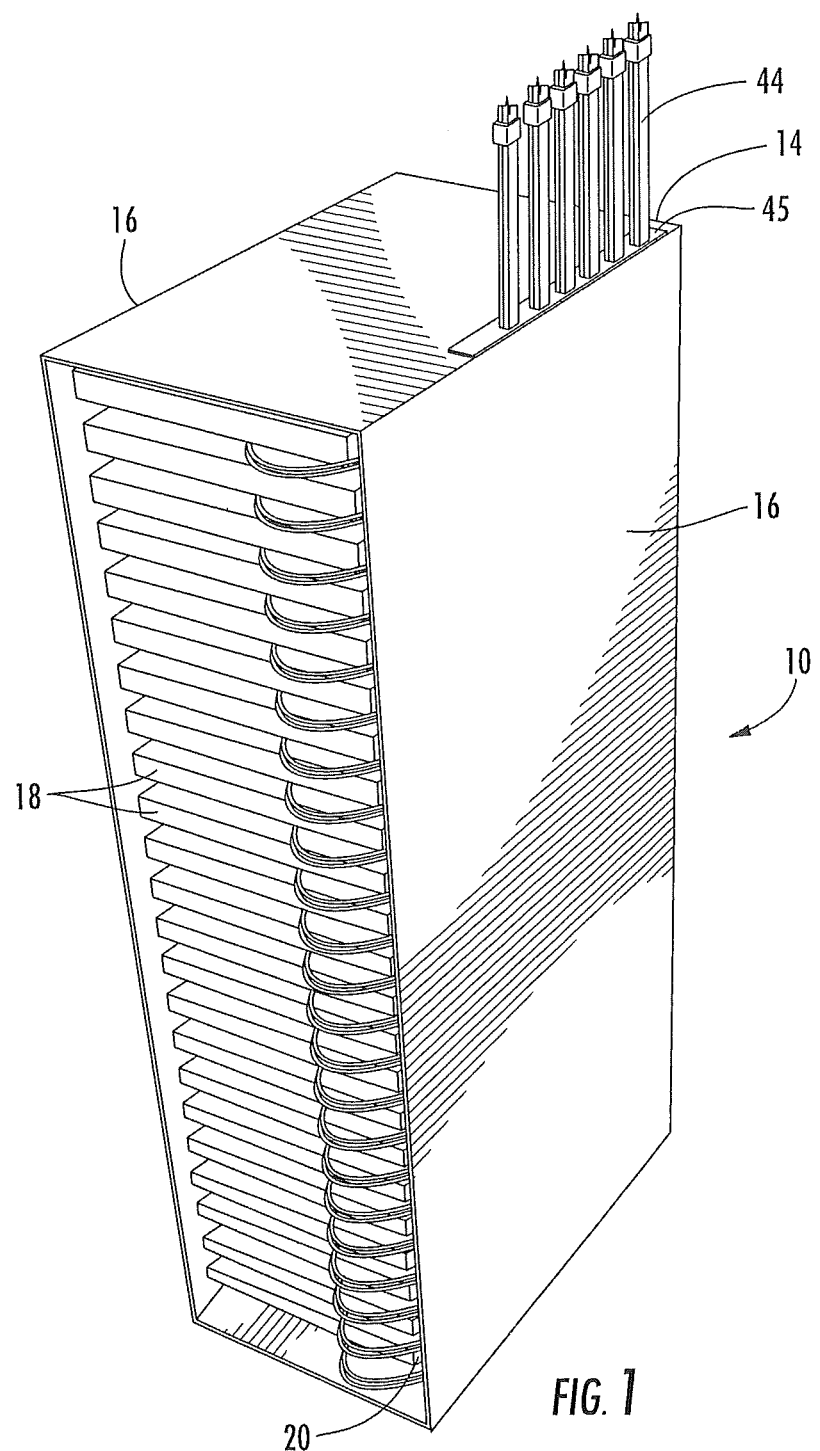
FIG. 1 is a perspective view of a communications cabinet that comprises an interconnection module according to embodiments of the present invention.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity. Well-known functions or constructions may not be described in detail for brevity and/or clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Referring now to the figures, a communications cabinet, designated broadly at 10, is shown in FIG. 1. The cabinet 10 includes a front wall (not shown), a rear wall 14, and opposing side panels 16. A plurality of datacommunications servers 18 (or other active network equipment) are mounted within the cabinet 10. Those skilled in this art will recognize that in some embodiments the cabinet may be replaced with a frame, rack or other datacommunications equipment mounting structure.

Figure 2:
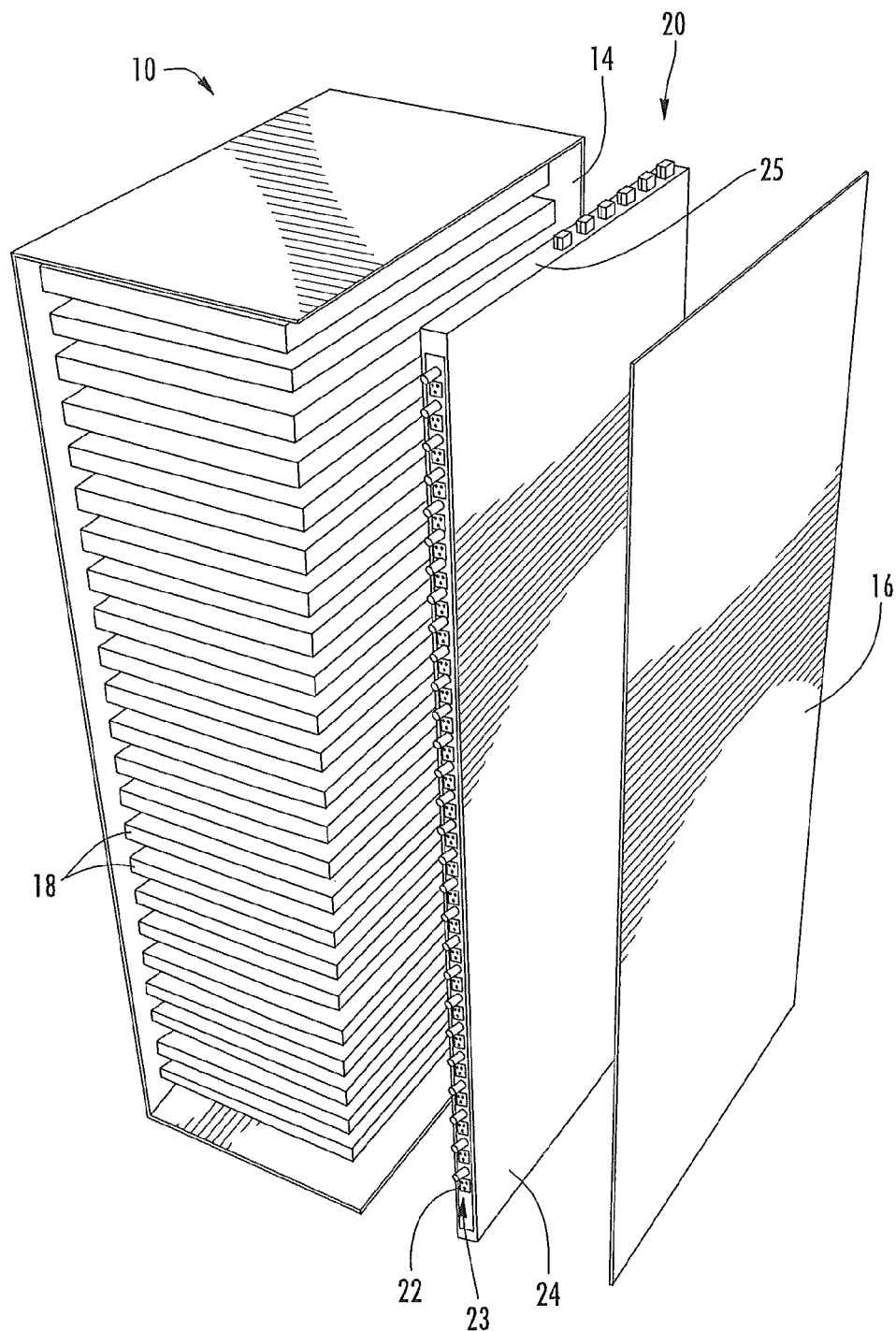
FIG. 2 is an exploded perspective view of the cabinet and module of FIG. 1.
Figure 3:
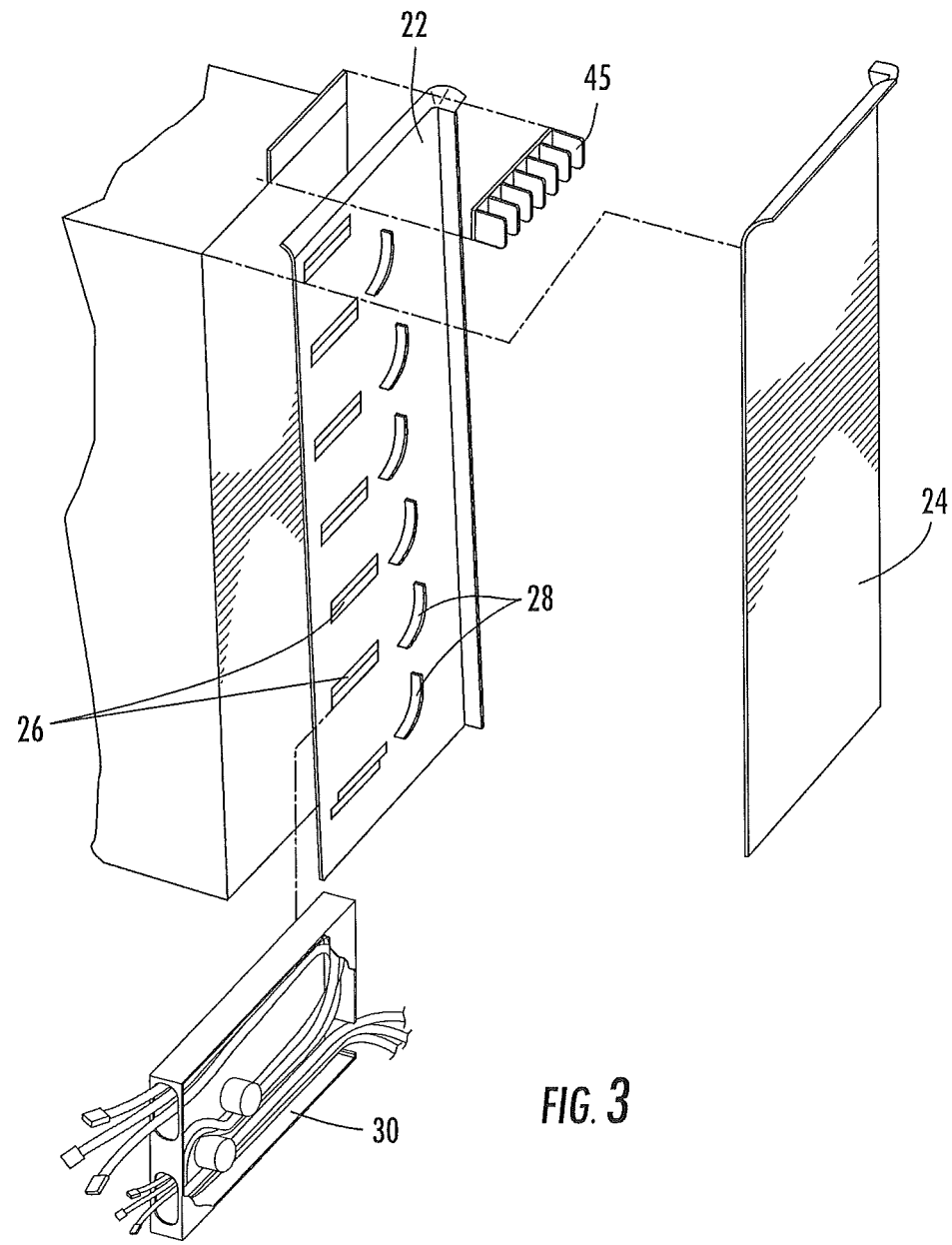
FIG. 3 is a further exploded perspective view of the module of FIG. 1.

Referring now to FIG. 2, the cabinet 10 also includes an interconnection module 20 positioned just inwardly from one of the side panels 16. The module 20 may be integrated into the cabinet 10, or may be added separately to an existing cabinet 10. As can be seen in FIGS. 2 and 3, the module 20 includes a divider panel 22 that separates the module 20 from the cavity of the cabinet 10 and a cover panel 24 (in some embodiments, one of the side walls 16 of the cabinet 10 may serve as the cover panel 24). An upper panel 25 spans the upper edges of the divider panel 22 and the cover panel 24. The divider panel 22 and the cover panel 24 form a narrow gap 23; in some embodiments, the gap 23 is between about 0.5 and 3.5 inches in depth, such that the entire module 20 is between about 1 and 4 inches in depth. The divider panel 22 includes multiple horizontally-disposed cassette guides 26 and an equal number of arcuate rear cord guides 28. FIG. 3 also illustrates one exemplary patch cord cassette 30 that engages one or more of the cassette guides 26; in a typical module 20, multiple cassettes 30 are included and are arranged in a vertical stack separated by the cassette guides 26.

Figure 4A:
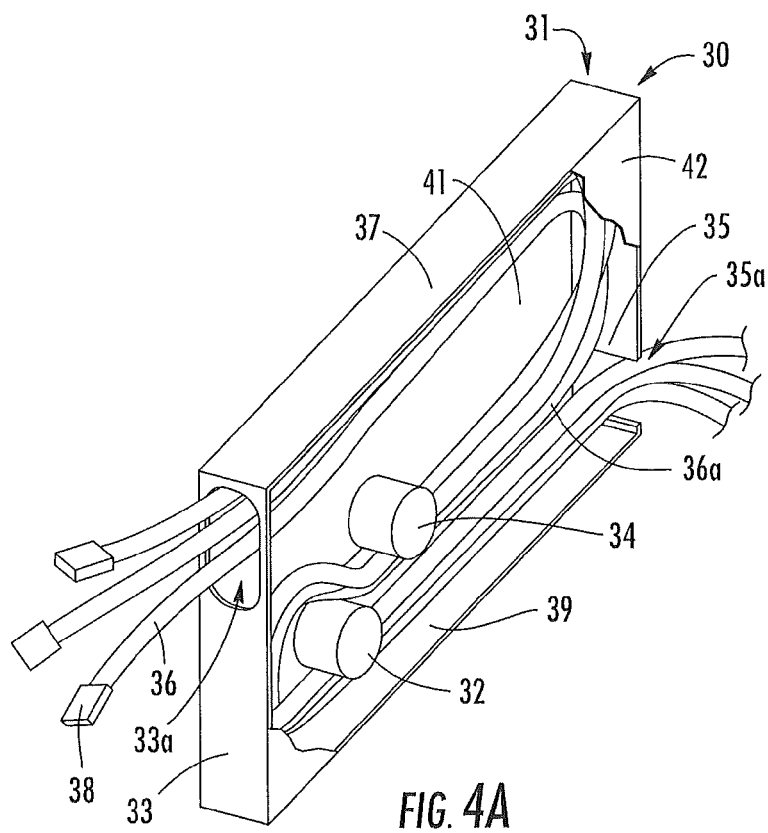
FIG. 4A is a perspective view of a cord storage compartment of the module of FIG. 3.
Figure 4B:
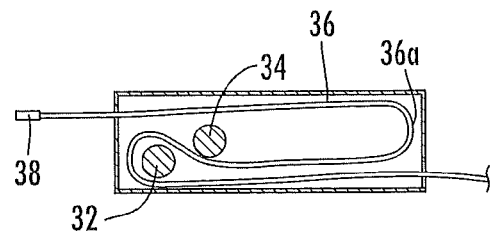
FIG. 4B is a side view of the cord storage compartment of FIG. 4A with the cords retracted.
Figure 4C:
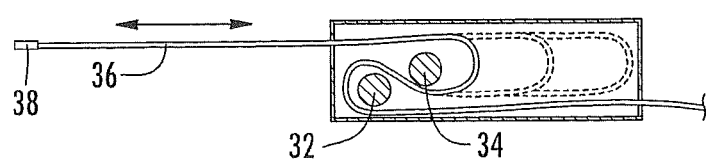
FIG. 4C is a side view of the cord storage compartment of FIG. 4A with a cord extended.

Referring now to FIGS. 4A-4C, each cassette 30 includes a rectangular housing 31 including front and rear panels 33, 35, top and bottom panels 37, 39, a base panel 41, and a cover 42. The rear panel 35 has an entry aperture 35a at its lower end, and the front panel 33 has an exit aperture 33a at its upper end.

A front spool 32 is fixed to the base panel 41 near the front lower corner thereof. A rear spool 34 is fixed to the base panel 41 upwardly and rearwardly from the front spool 32.

Referring still to FIG. 4A, a plurality of unbundled (i.e., separated) patch cords 36 are routed into and out of the cassette 30. Those skilled in this art will recognize that the patch cords 36 may be fiber optic patch cords, copper patch cords, or a combination of fiber and copper. The patch cords 36 enter the cassette 30 through the entry aperture 35a (where they are typically fixed), travel forwardly to the front spool 32, loop under, around and over the front spool 32, pass below the rear spool 34 and to the rear panel 35, then loop upwardly and travel forwardly to the exit aperture 33a. In following this path, it can be seen that each of the patch cords 36 forms a slack loop 36a that extends between the rear spool 34 and the exit aperture 33a. The bottom panel 39, the rear panel 35, and the top panel 37 contain the slack loop 36a, which has sufficient rigidity and resilience that it presses against these panels when bent into the looped configuration described. As such, the slack loop 36a remains present in the patch cord 36 unless it is disturbed. The patch cords 36 terminate with connectors/adapters 38, which extend slightly forwardly of the front panel 33.

As can be seen in FIGS. 4B and 4C, the arrangement of the patch cords 36 within the cassette 30 enables the patch cords 36 to move between a stored position (shown in FIGS. 4A and 4B and described above) and an extended position (shown in FIG. 4C). From the stored position of FIGS. 4A and 4B, an operator can extend one or more of the patch cords 36 simply by pulling forward on the patch cord 36. The patch cord 36 can be extended forwardly until the slack loop 36a of the patch cord 36 reaches the rear spool 34 (FIG. 4C). From this forward position, the patch cords 36 can be connected to one of the servers 18 of the cabinet 10 (see FIG. 1). The patch cords 36 can be returned to a stored position by pushing rearwardly on the patch cord 36 to force it to return to the cassette 30. Each patch cord 36 is typically sufficiently rigid that pushing on it will return it to the space within the cassette 30 that it previously occupied and re-form the slack loop 36a. As such, the patch cords 36 can avoid tangling or the like with other patch cords 36. Typically, the patch cords 36 and slack loops 36a are arranged to extend up to about 2-3 feet.

Referring back to FIGS. 1 and 2, the ends of the patch cords 36 of each cassette 30 opposite the terminals 38 are gathered into a cord bundle 44 (the bundle may be created by associated loose patch cords with a twist tie or the like, or the patch cords may be joined or connected with a web, jacket or the like). The cord bundle 44 is routed from the entry aperture 35a into a downwardly-extending slack loop 44a (seen in FIG. 5), then upwardly to a patch pack organizer 45 that is attached to the upper panel 25 of the module 20. The cord bundle 44 is able to extend from the module 20 to interconnect with other equipment, such as an overhead patch panel. The distance of cord bundle extension from the module 20 is typically between about 1 and 3 feet, and may be as much as 6 feet.

Figure 5:
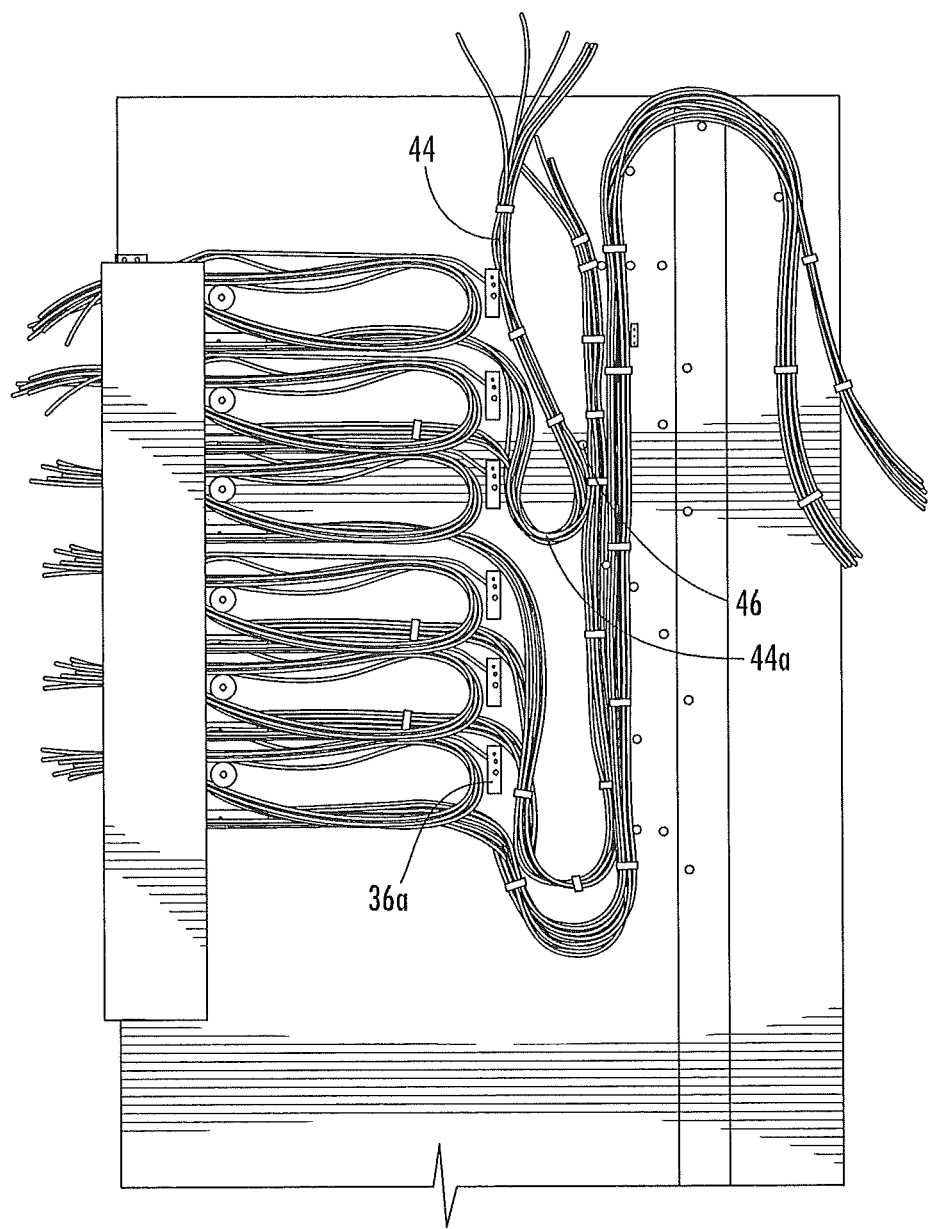
FIG. 5 is a side view of an interconnection module similar to that shown in FIG. 1, wherein the cords are retracted.

This arrangement can be seen in FIGS. 5 and 6. A cord bundle 44 enters the upper edge of the module 20. Guides/posts 46 may be present to organize the cord bundle 44 and to form the slack loops 44a so that they may be extended/retracted from the module 20. Each of the cord bundles 44 is routed through the guides 46 to an entry aperture 35a of one of the cassettes 30. The patch cords 36 of the cord bundles 44 are separated, threaded around the front spool 32 and rear spool 34 as discussed above, and routed out of the exit aperture 33a. FIG. 5 shows this arrangement with all of the patch cords 36 fully retracted and stored. FIG. 6 shows one of the patch cords 36 extended through the exit aperture 33a. From this position the patch cord 36 can be interconnected with one of the servers 18 of the cabinet 10.

FIGS. 7A-7C illustrate three different cabinet configurations that may be suitable for use with the module 20. FIG. 7A shows the cabinet 10 positioned near an overhead patch panel 50. The cord bundles 44 from the module 20 are extended from the upper edge of the module 20 and interconnected with the patch panel 50. Patch cords 36 extend from the module 20 and interconnect with servers 18 in the cabinet 10. FIG. 7B shows a cabinet 10' that includes a "top of rack" (ToR) patch panel 60. Individual patch cords 36 can be connected with the rack-mounted patch panel 60 and with servers 18 of the cabinet 10'. FIG. 7C shows a cabinet 10" that receives an external fiber uplink 62 in a "top-of-rack" ToR switch 70 mounted in the cabinet 10". Patch cords 36 connect with the switch 70 and with the servers 18. FIG. 7D shows a series of cabinets 10''' that are part of an "end of row switch" (EOR) system, in which a series of switches 80 mounted on a rack 82 are connected with cord bundles 44 to the modules 20 mounted on the cabinets 10'''. Other cabinet configurations will also be apparent to those of skill in this art.

Because the module 20 is very slender, it can fit either within the cabinet 10 as shown, or can be added to the side wall of a cabinet as desired. The first instance does not increase overall width of the standard cabinet, and the second instance does so only slightly. As such, very little or no valuable space inside or beside the cabinet is lost. It is also notable that the module 20 does not reside within any of the space ordinarily occupied by the servers 18, such that no server ports are lost in order to include the module 20. It also allows for the preconfiguration of cabinets for specific server (or other network equipment) copper/fiber connectivity needs, allowing rapid deployment of cabinets as "plug and play" devices.

Those skilled in this art will recognize that other configurations of the module 20 may also be suitable. For example, the locations of the front and rear spools 32, 34 and/or the entry and exit apertures 35a, 33a may be varied. Retraction of the patch cords 36 may be more actively performed; for example, the rear spool 34 may be located in a slot that extends rearwardly and allows the rear spool 34 to move rearwardly, and a spring-loading mechanism may be associated with the rear spool 34 to bias it toward the rearward (retracted) position.

Those skilled in this art will appreciate that, although the module 20 is shown in use with a cabinet, the module 20 may also be used with a rack, frame or other datacommuncations/telecommunications structure.

An alternative embodiment of a cassette of the present invention is shown in FIGS. 8-21 and designated broadly at 130. In this embodiment, both twisted pair copper patch cords 136 and fiber optic cables 156 are present, which can provide the system with great flexibility.

Figure 8:
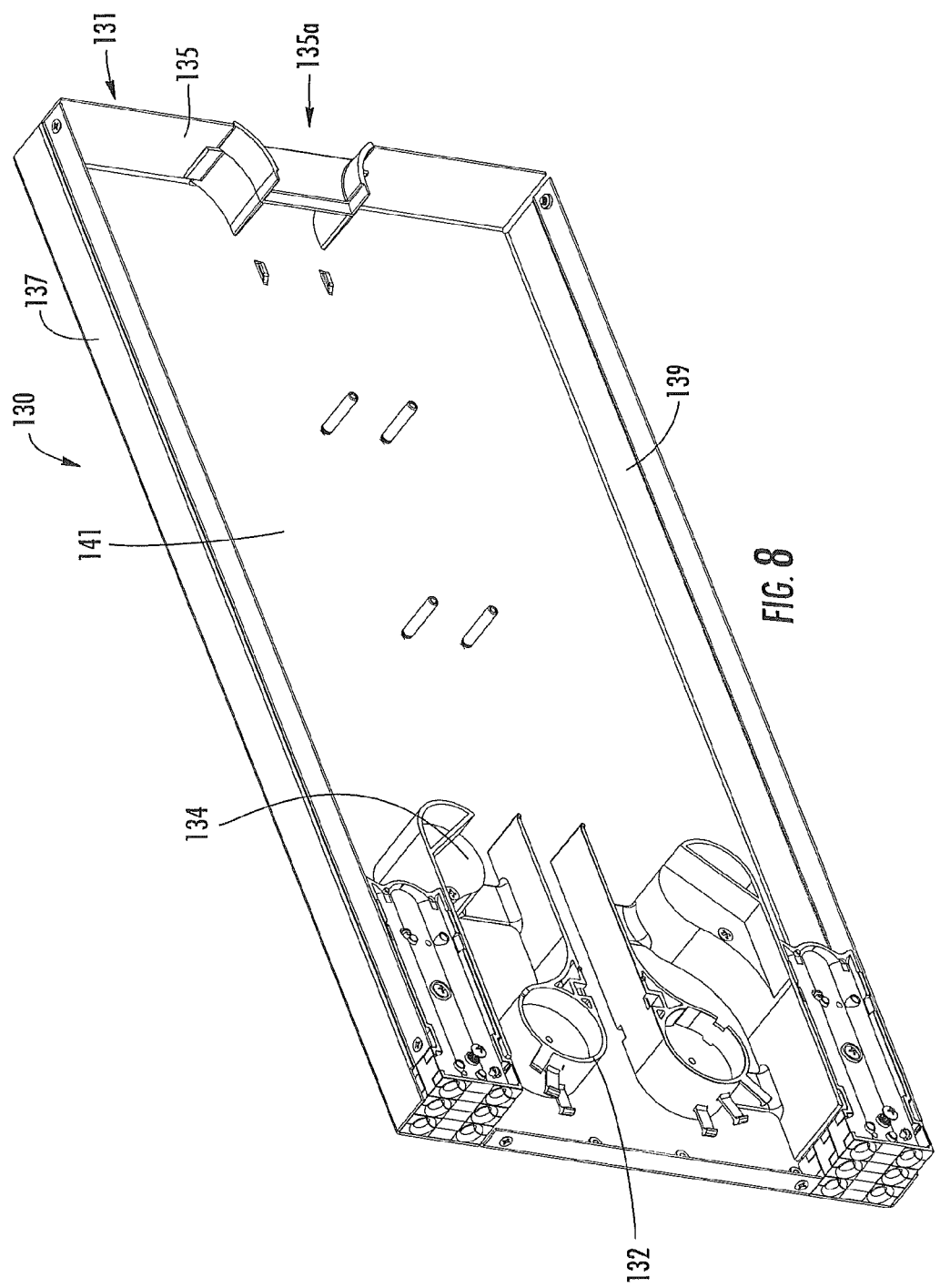
FIG. 8 is a cutaway perspective view of a cord storage cassette according to alternative embodiments of the present invention.
Figure 9:
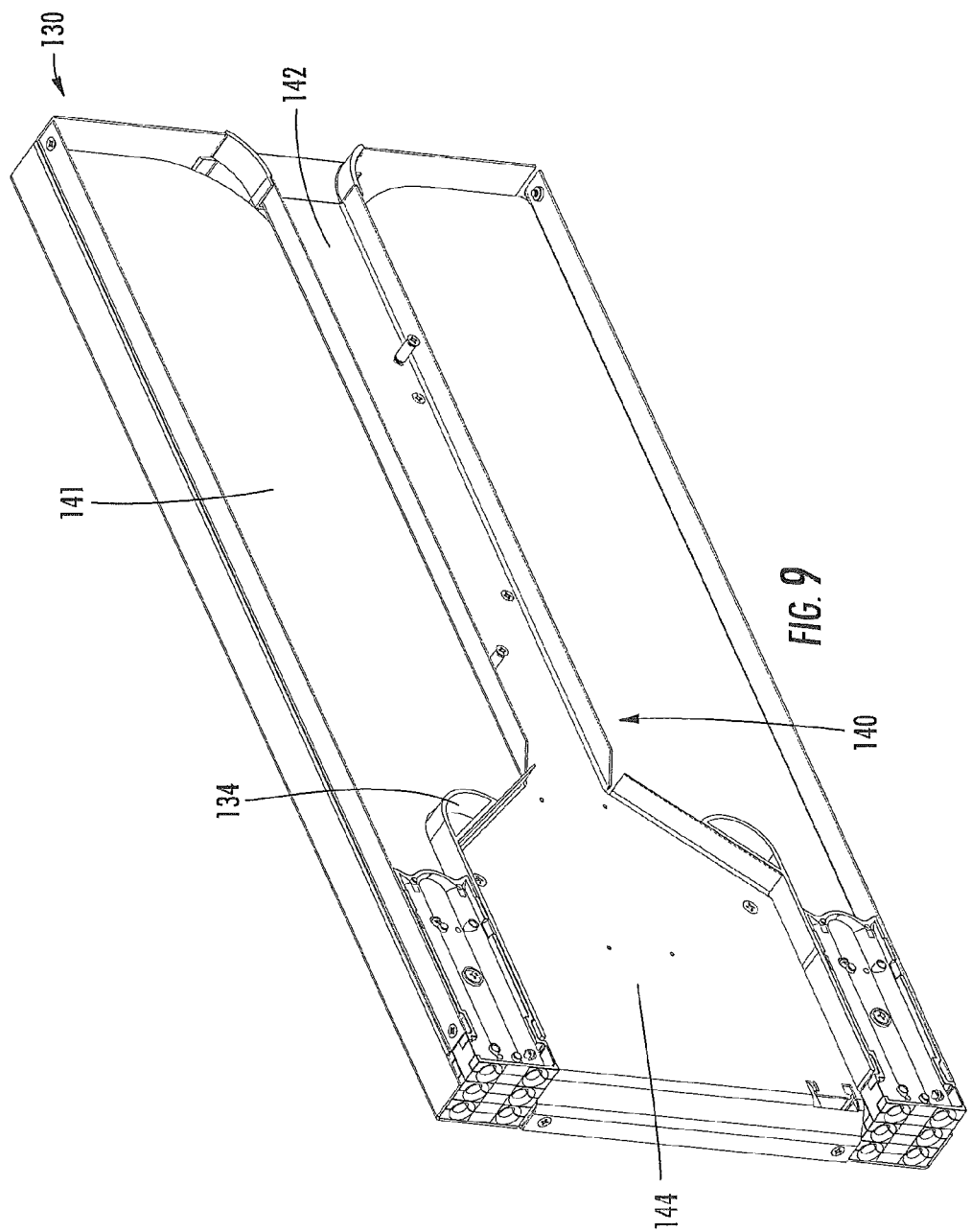
FIG. 9 is a cutaway perspective view of the cord storage cassette of FIG. 8 with the fiber cable trough in place.
Figure 10:
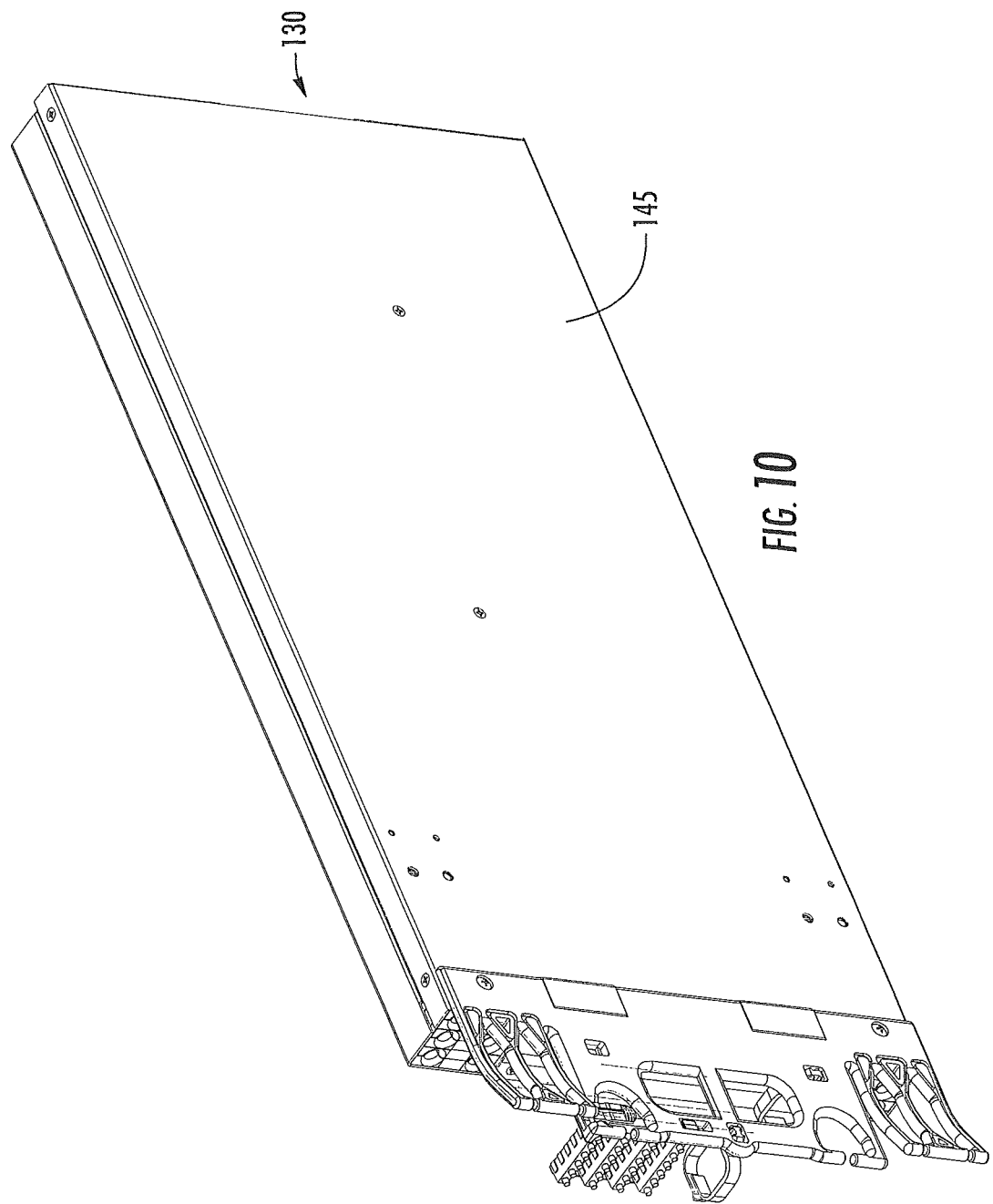
FIG. 10 is a perspective view of the cord storage cassette of FIG. 8 in an assembled condition.
Figure 11:
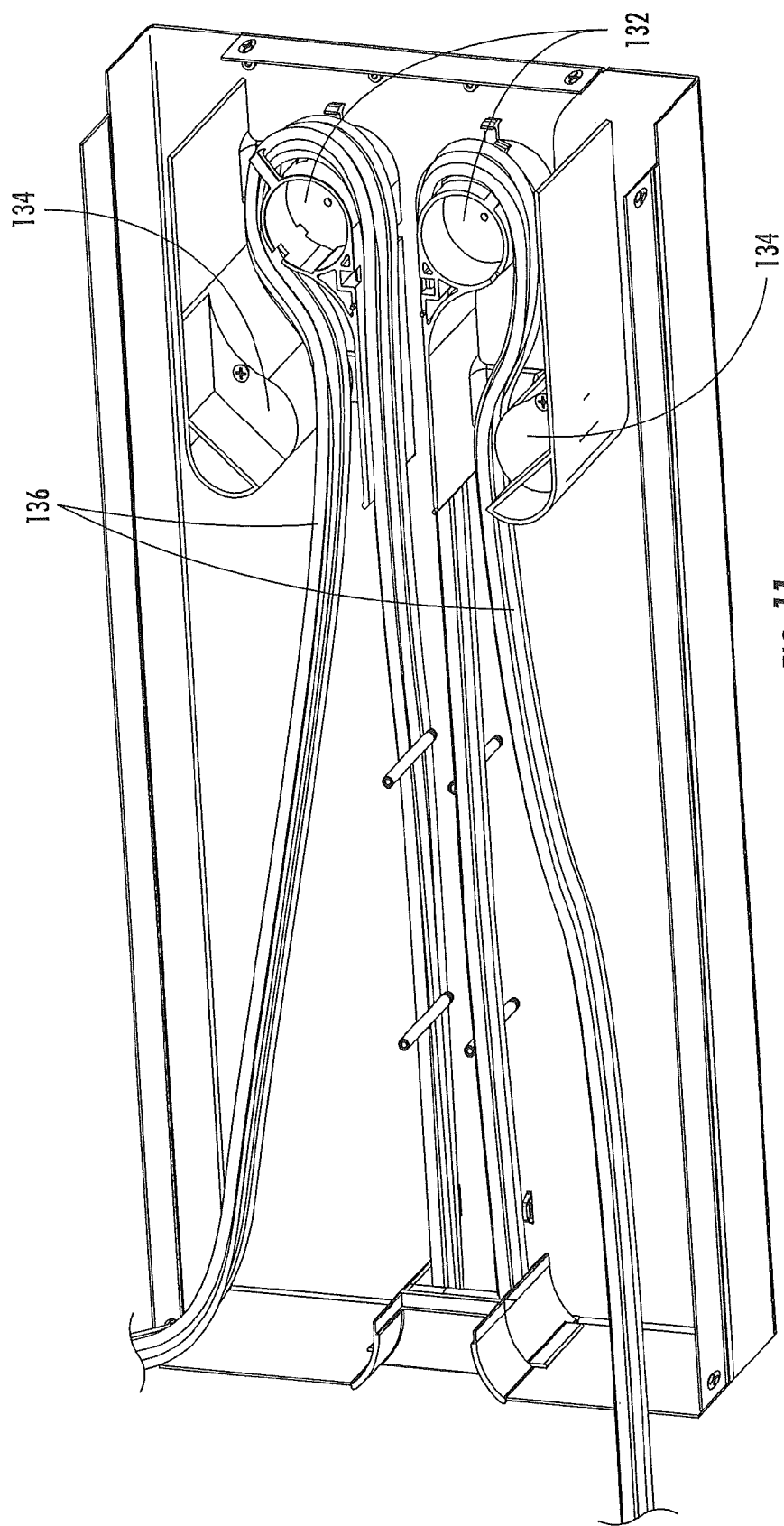
Figure 12:
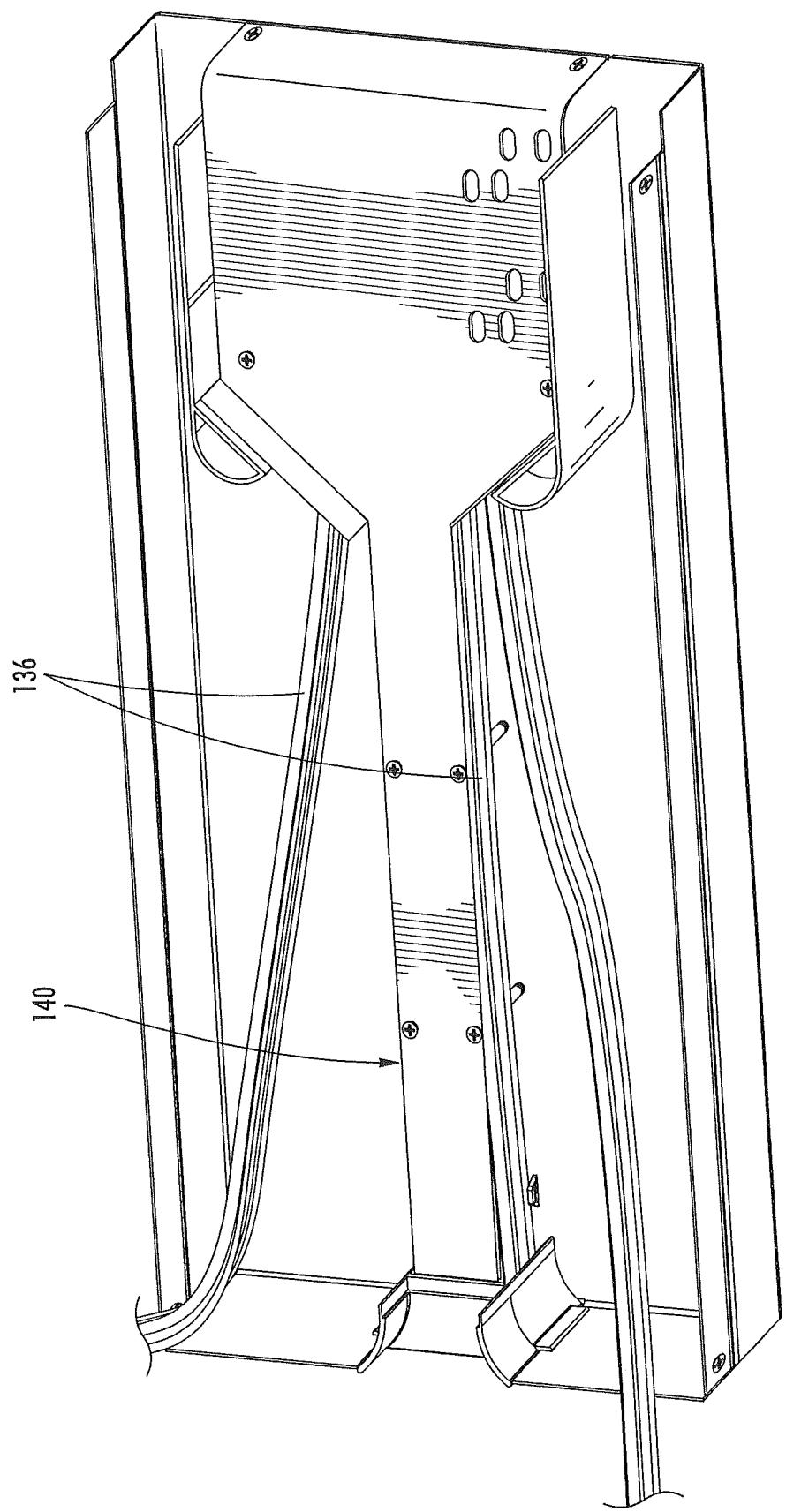
Figure 13A:
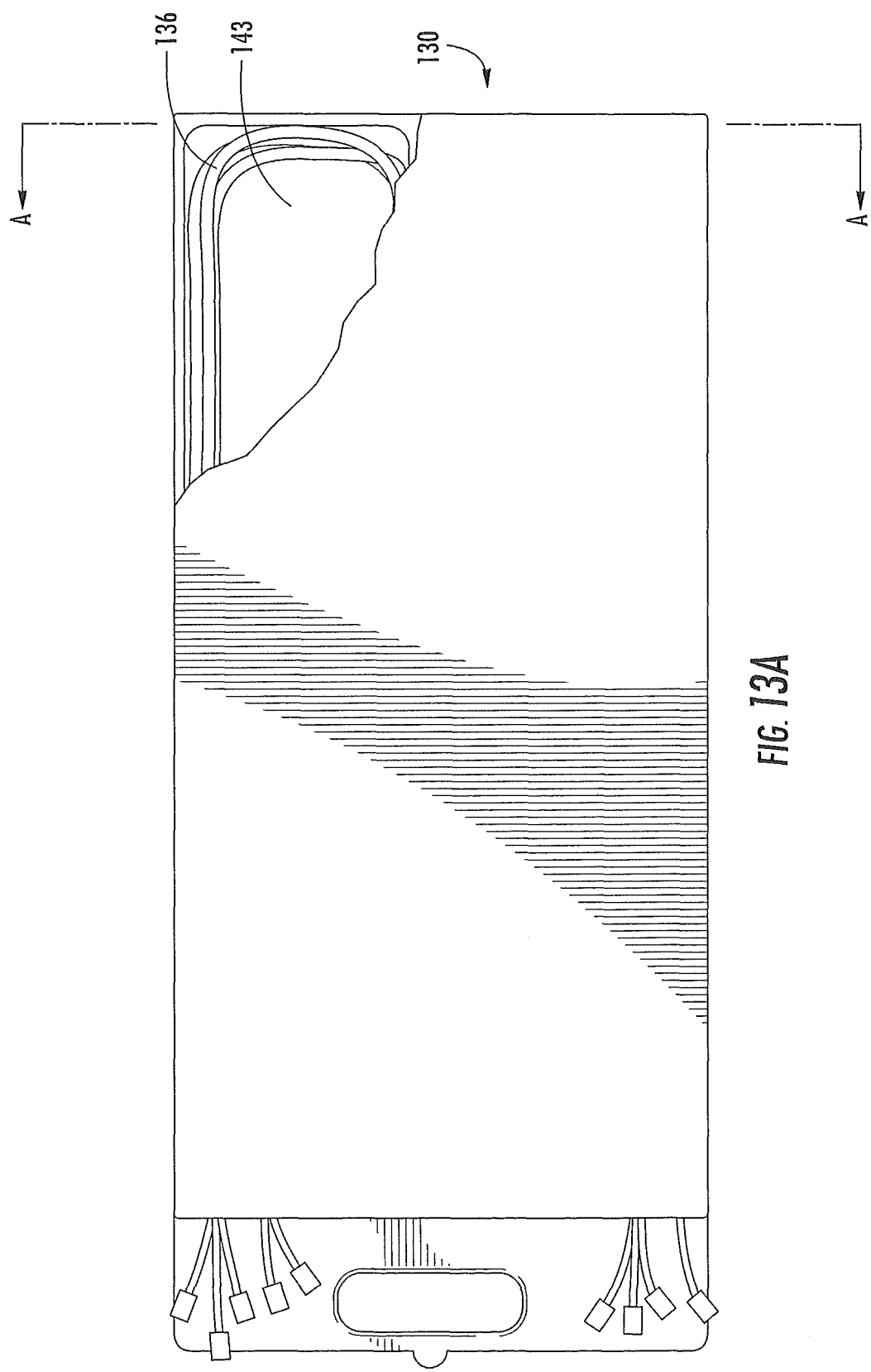
FIG. 13A is a cutaway side view of an assembled cassette showing two copper patch cord slack loops and FIG. 13B is a section view taken along lines A-A of FIG. 13A that shows the separators between slack loops.
Figure 13B:
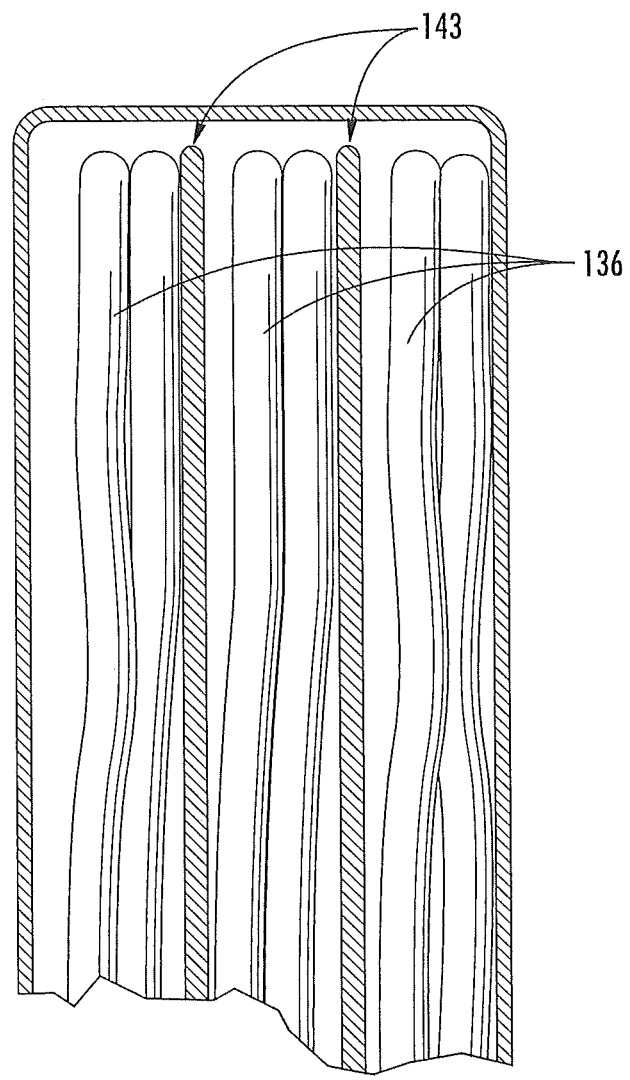
Figure 14:
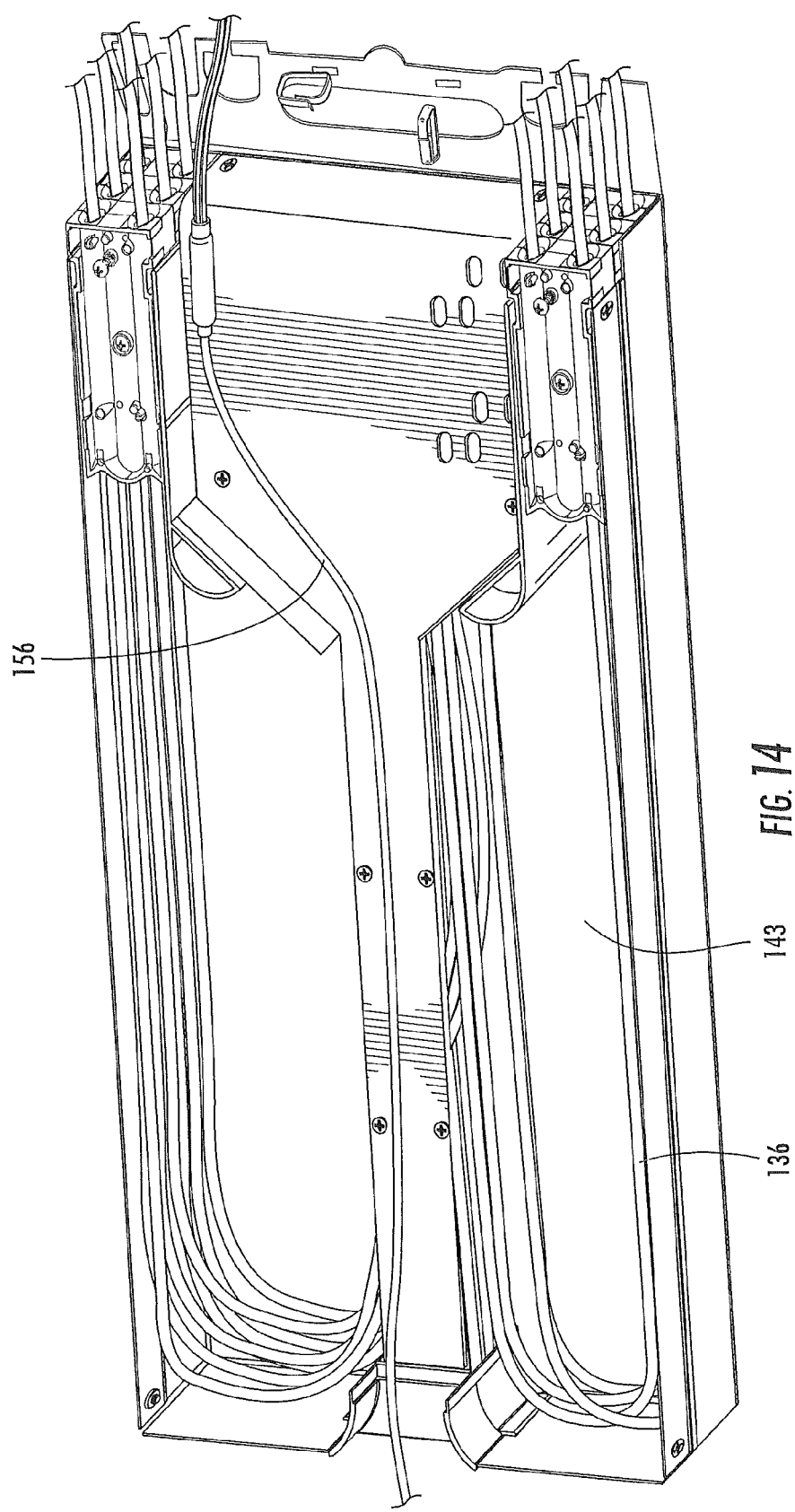
Figure 15:
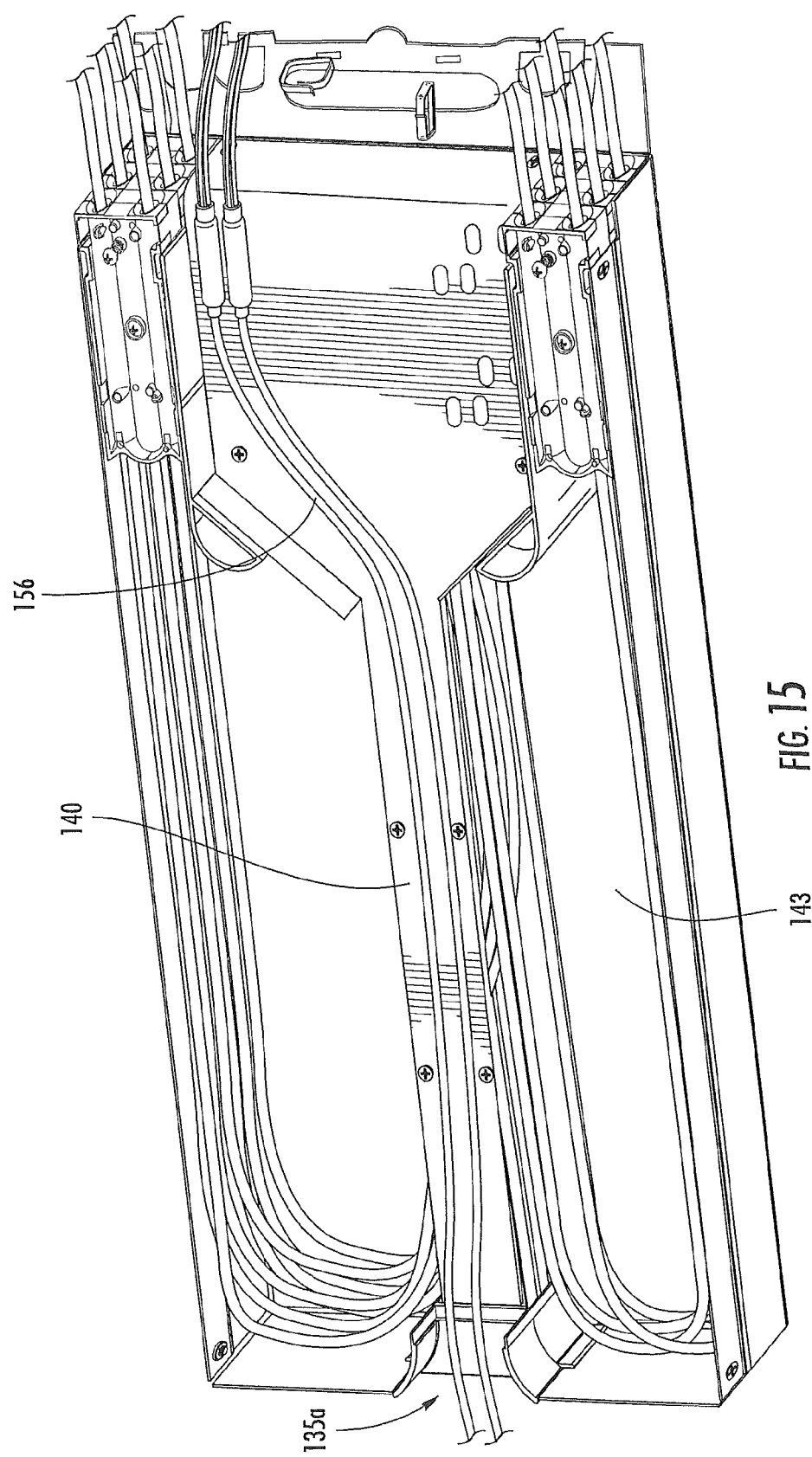
Figure 16:
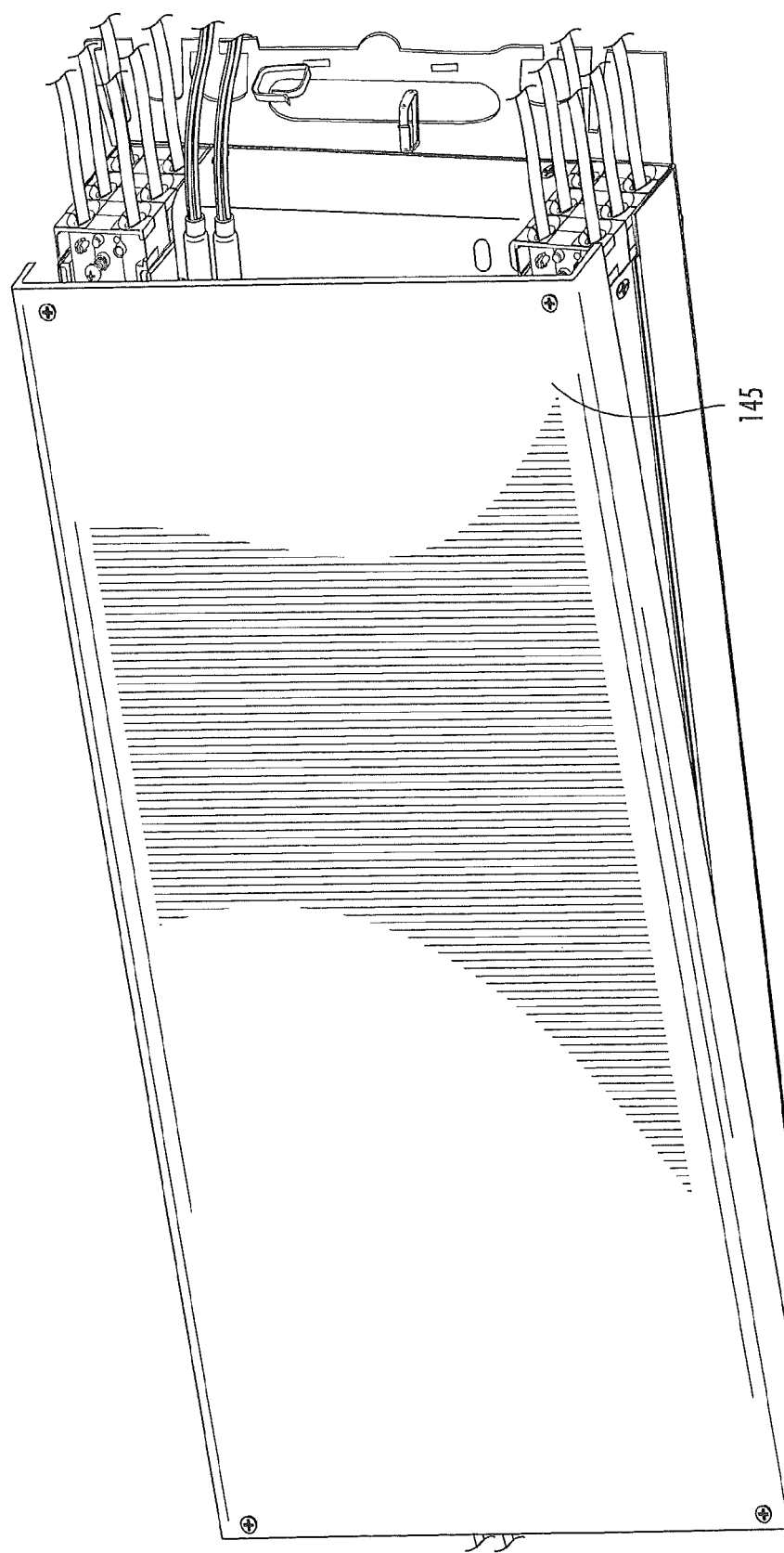

As shown in FIGS. 8-10, the cassette 130 has a rectangular housing 131 including a rear panel 135, top and bottom panels 137, 139, a base panel 141, and a cover 145 (shown in FIGS. 10 and 16). An entry window 135a is present in the rear wall 135 that receives copper patch cords 136. Referring to FIGS. 9 and 12-18, a fiber optic cord trough 140 is mounted onto the lobed guides 132, 134 and the entry window 135a. The trough 140 has a walled channel portion 142 and a walled, generally pentagonal open portion 144.

Figure 17:
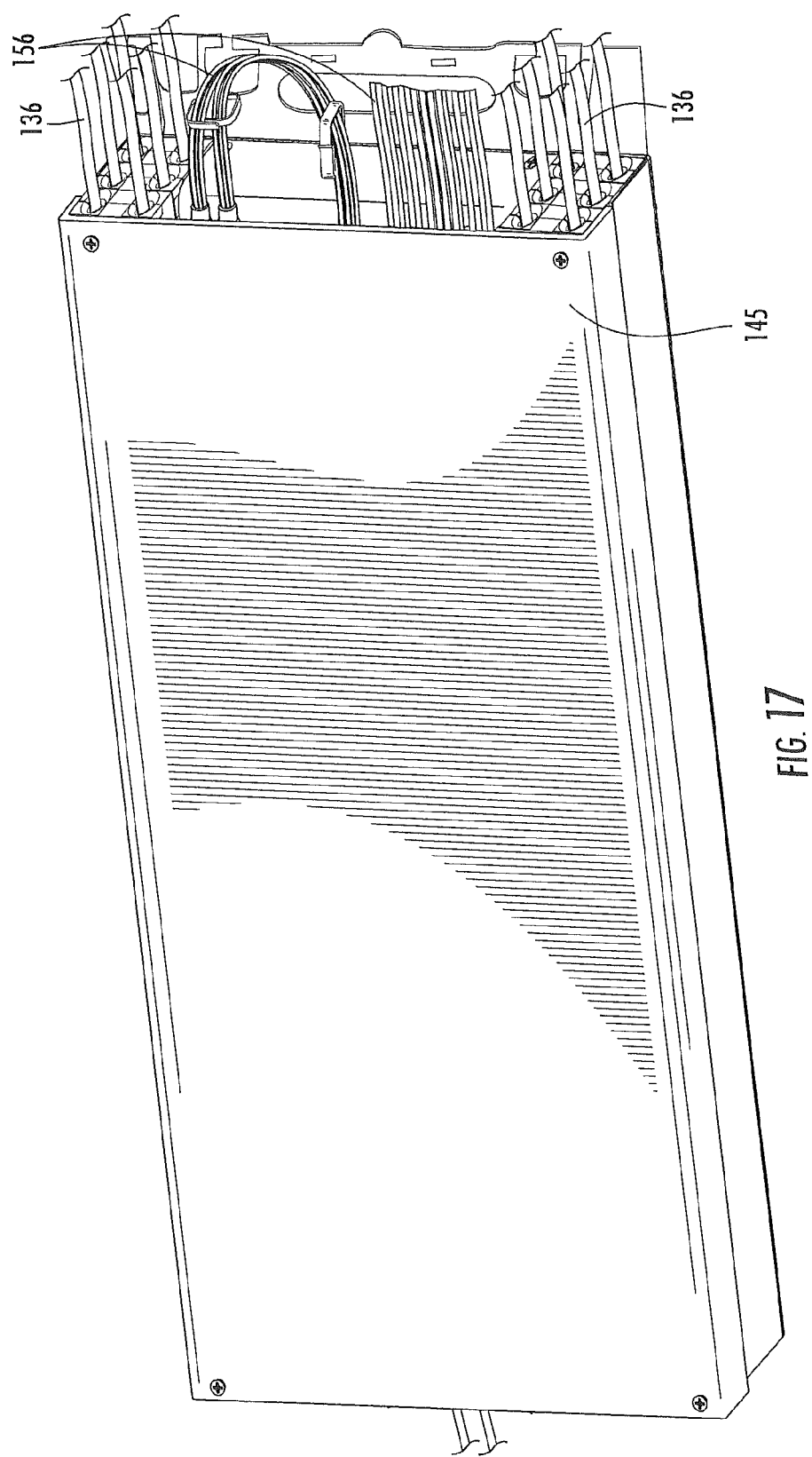
Figure 18:
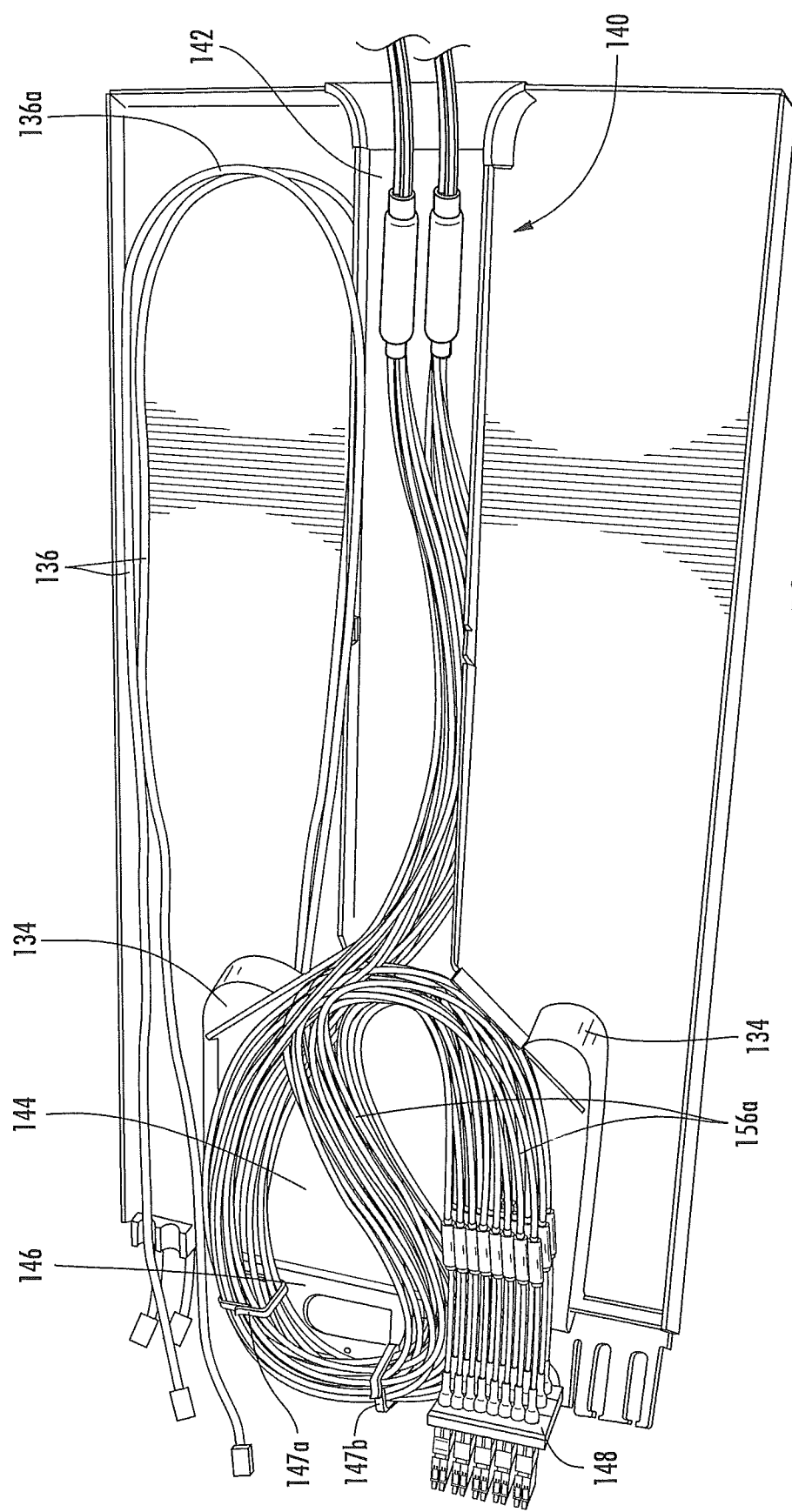
FIG. 18 is a cutaway perspective view of the cord storage cassette of FIG. 8 with both copper and fiber cables in place.

As shown in FIG. 18, the copper patch cords 136 are routed around lobed guides 132, 134 (the guide 132 is not shown in FIG. 18) to form a sinuous slack loop 136a. Although only one set of copper patch cords 136 is illustrated in FIG. 18, it is to be understood that a second set of copper patch cords will typically be inserted into the entry window 135a and routed around a lower set of lobed guides 132, 134, as is shown in FIGS. 11-17. It can also be seen in FIGS. 13, 13A and 13B that pairs of copper patch cords 136 may be separated from each other by separators 143. The separators 143, which are flat sheets that are inserted between pairs of patch cords 136, can prevent tangling of the patch cards 136 as they are extended and retracted from the module 130.

As shown in FIG. 18, fiber optic patch cords 156 are routed from the rear wall 135 forwardly in the channel portion 142, then through an upper area of the open portion 144 and through two routing loops 147a, 147b mounted on a routing panel 146 that is attached to the base panel 141. From there, the fiber optic patch cords 156 follow a sinuous path within the open portion 144 (forming a slack loop 156a) until they reach an organizing comb 148 (FIGS. 18-20) mounted on the routing panel 146.

Figure 19:
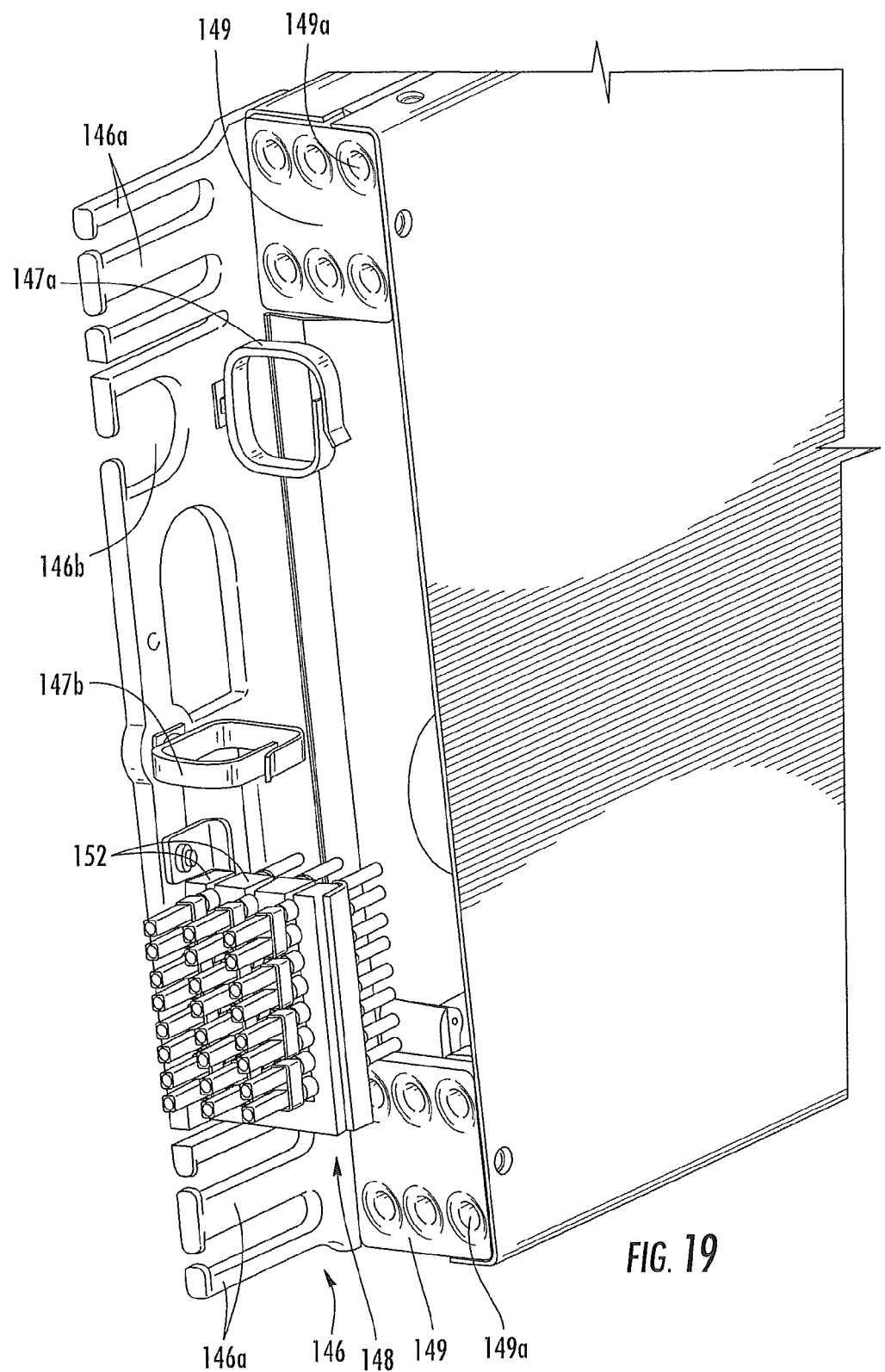
FIG. 19 is a perspective view of the front end of the cord storage cassette of FIG. 8.
Figure 20:
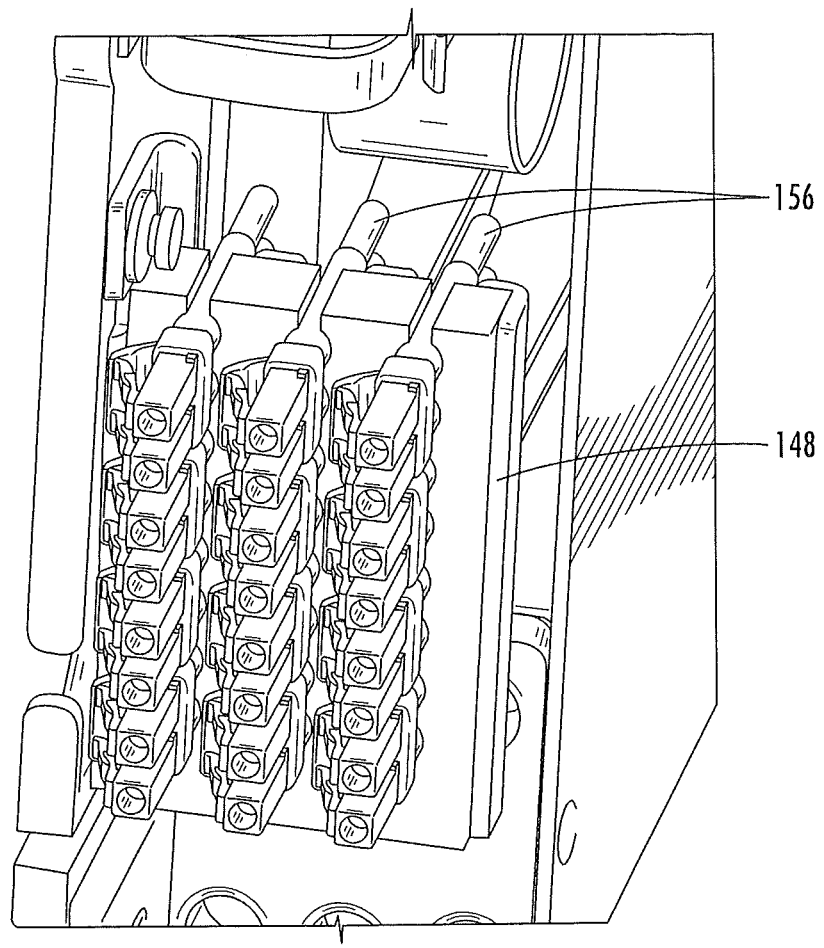
FIG. 20 is an enlarged perspective view of the fiber organizing comb for the cord storage cassette of FIG. 8.
Figure 21:
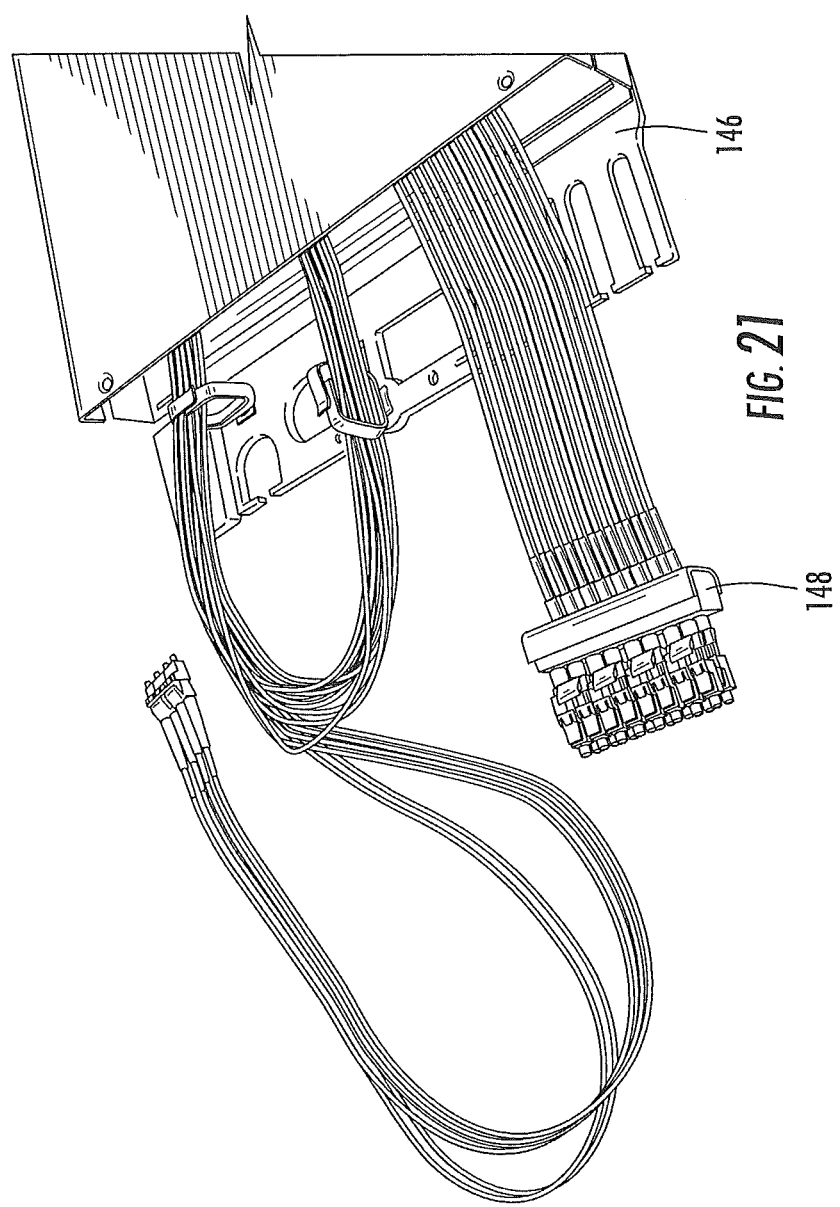
FIG. 21 is a perspective view of the cord storage cassette of FIG. 8 with the fiber organizing comb of FIG. 20 detached therefrom.

As can be seen in FIG. 19, upper and lower cable indexing panels 149 with apertures 149a for receiving copper patch cords 136 are mounted just rearward of the routing panel 146. The copper patch cords 136 are routed into the apertures 149a. From this position, the copper patch cords 136 can be extended (much in the manner described above for the patch cords 36) until the slack loop 136a becomes taut around the lobed guides 132, 134. The routing panel 146 includes projections 146a between which copper patch cords 136 can be routed when extended. The organizing comb 148 includes foam-lined tines 152 between which the fiber optic patch cords 156 can be inserted when the fiber optic patch cords 156 are retracted. The fiber optic patch cords 156 can be removed from the organizing comb 148 and extended until the slack loop 156a disappears (in some embodiments, and as shown in FIG. 21, the organizing comb 148 may detach from the routing panel 146 to facilitate manipulation of the patch cords 156). The routing panel 146 includes apertures 146b through which fiber optic patch cords 156 can be routed when extended.

As can be seen in FIGS. 10, 16 and 17, a cover 143 serves as a side wall of the cassette 130 opposite the base panel 141.

The cassette 130 can thus provide an organized system that includes both copper and fiber optic patch cords, either or both of which can remain organized when extended or when subsequently retracted. The copper patch cords 136 remain organized by the presence of the lobed guides 132, 134, which urge the copper patch cords 136 to initially assume and subsequently return to the illustrated sinuous configuration. The fiber optic patch cords 156 remain organized by the presence of the routing loops 147a, 147b and the open portion 144, which urge the fiber optic patch cords 156 to initially assume and subsequently return to the illustrated configuration. As a result, either or both can be extended as needed, then returned to their original organized arrangement as desired.

As should be recognized by those of skill in this art, either of the modules 20, 120 can provide "plug and play" capability in connecting cables from an outside source (e.g., an overhead patch panel, a TOR switch, an EOR switch system, or the like) to one or more server cabinets. The outside source can be connected to the cord bundles 44 of the module, and the patch cords 36, 136, 156 can then be connected with the cabinets/racks within the data room, and all of this can be accomplished in an organized fashion, with versatility in the length of patch cord or cord bundle available for connection. Such a module can greatly simplify connection of an outside source to the servers within the cabinets/racks.

Figure 22:
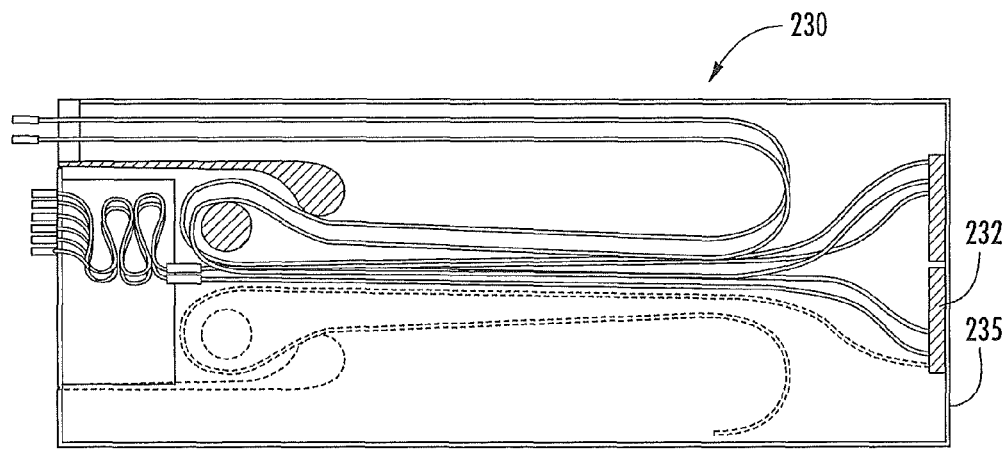
FIGS. 22 and 23 are side and rear views, respectively, of a cord storage cassette according to additional embodiments of the present invention.
Figure 23:
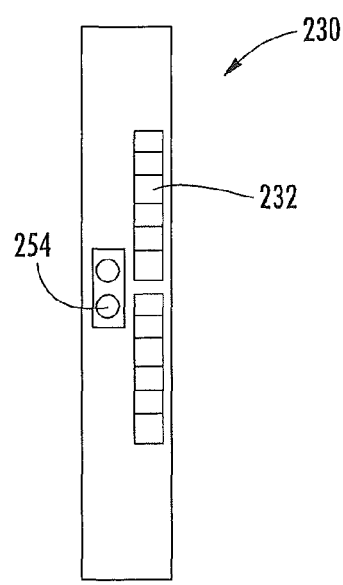

FIGS. 22 and 23 illustrate a cassette, designated broadly at 230, according to other embodiments of the present invention. The cassette 230 includes outlets 232 in the rear wall 235 for copper cables and outlets 254 for fiber cables. As a result, cables and/or cord bundles can be connected to the rear of the cassette 230, which may simplify further interconnection of the cassette 230.

It will also be apparent that the gap 23 in which modules 20 reside may also be employed to house other components. For example, the gap 23 may house one or more of the following components: a wireless module; a power distribution unit; a network switch; a battery back-up unit; an environmental monitoring unit; a security camera; an RFID sensor; a media converter; a air conditioner/chiller; a security access control module; a bonding/grounding unit; a KVM switch; a lighting unit; a labeling unit; a data storage unit; a robotic arm; a tape drive; and an intelligent patching manager.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A cassette for use in a datacommunications equipment mounting structure, comprising:
   a base panel;
   a cover panel disposed generally parallel to the base panel, the cover panel and base panel being spaced apart from each other to form a gap;
   a rear wall that spans the gap between the base panel and the cover panel, a rear aperture being present in the rear wall; and
   a plurality of datacommunications cords positioned in the gap between the base panel and cover panel, the datacommunications cords having first and second ends and being routed from the rear aperture to a front portion of the base panel and forming a datacommunications cord slack loop, the first ends being adjacent the front portion of the base panel;
   wherein the datacommunications cords are separately moveable between a stored position, in which the first ends are located at adjacent front edges of the base and cover panels, and an extended position, in which the first ends are positioned away from the front edges of the base and cover panels.

2. The cassette defined in claim 1, wherein the plurality of datacommunications cables comprises a plurality of copper patch cords and a plurality of fiber optic cables.

3. The cassette defined in claim 1, wherein the plurality of datacommunications cables comprises either a plurality of copper patch cords or a plurality of fiber optic cables.

4. The cassette defined in claim 2, further comprising a fiber guide trough mounted between the base panel and the cover panel, the fiber guide trough separating the copper patch cords from the fiber optic cables.

5. The cassette defined in claim 2, wherein the fiber guide trough includes a channel portion and an open portion, and wherein the fiber optic cable slack loop resides in the open portion.

6. The cassette defined in claim 2, further comprising a fiber organizing comb mounted to a front portion of the module, and wherein the fiber optic cables are inserted into the fiber organizing comb.

7. The cassette defined in claim 6, wherein the fiber organizing comb is detachable from the front portion of the module to facilitate removal of the fiber optic cables from the fiber organizing comb.

8. The cassette defined in claim 1, wherein the cassette has a width of between about 0.5 and 3.5 inches.

9. The cassette defined in claim 1, wherein connectors for datacommunications cords are mounted in the rear wall.

10. A datacommunications system, comprising:
   a telecommunications rack, frame or cabinet; and
   a plurality of cassettes as defined in claim 1 mounted to the rack, frame or cabinet.

11. The datacommunications system defined in claim 10, further comprising a server mounted to the rack, frame or cabinet, wherein at least some of the first ends of the datacommunications cables are connected with the server.

* * * * *